(12) United States Patent
Sheeley et al.

(10) Patent No.: US 8,448,107 B2
(45) Date of Patent: May 21, 2013

(54) METHOD FOR PIECEWISE HIERARCHICAL SEQUENTIAL VERIFICATION

(75) Inventors: Nathan Francis Sheeley, Austin, TX (US); Mark H. Nodine, Austin, TX (US); Nicolas Xavier Pena, Austin, TX (US); Irfan Waheed, Austin, TX (US); Patrick Peters, Austin, TX (US); Adrian J. Isles, Alameda, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 13/127,936

(22) PCT Filed: Jul. 8, 2009

(86) PCT No.: PCT/US2009/049930
§ 371 (c)(1),
(2), (4) Date: May 5, 2011

(87) PCT Pub. No.: WO2010/053603
PCT Pub. Date: May 14, 2010

(65) Prior Publication Data
US 2011/0214096 A1  Sep. 1, 2011

Related U.S. Application Data

(60) Provisional application No. 61/112,440, filed on Nov. 7, 2008.

(51) Int. Cl.
*G06F 17/50* (2006.01)
(52) U.S. Cl.
USPC .......................................... 716/106; 716/107
(58) Field of Classification Search
USPC ........................ 716/106, 107, 136
See application file for complete search history.

(56) References Cited

U.S. PATENT DOCUMENTS

| 2008/0244482 A1 | 10/2008 | Chang et al. |
| 2008/0263484 A1 | 10/2008 | Kobayashi |
| 2008/0288759 A1* | 11/2008 | Gonion et al. ............ 712/235 |
| 2010/0257494 A1* | 10/2010 | Pouarz et al. ............ 716/5 |

FOREIGN PATENT DOCUMENTS

JP  2008-117110  5/2008

OTHER PUBLICATIONS

International Search Report and Written Opinion from PCT/US2009/049930, mailed Jan. 27, 2010, 11 pages.

* cited by examiner

*Primary Examiner* — Vuthe Siek
(74) *Attorney, Agent, or Firm* — Meyertons, Hood, Kivlin, Kowert & Goetzel, P.C.

(57) ABSTRACT

This disclosure describes a method for accomplishing sequential logical equivalence verification using a hierarchical piecewise approach. Initially, the method provides a reference semiconductor design and a second semiconductor design with logic edits relative to it. The method submits both to formal verification to check the reference design against the second semiconductor design with all edits disabled 200. The semiconductor design is partitioned 202 and associated input constraints 204. The edits are further grouped 206 and ordered 208. The invention also discovers a set of dependencies of the logic edits 210 and checks that the ordering of groups obeys the dependencies 212. Each group of edits is further submitted to formal verification 214 and any input constraints assumed for any partitions are verified in their enclosing partition 216. Finally, the method reports success if formal verification succeeds on each group of logic edits and on each set of input constraints 218.

20 Claims, 21 Drawing Sheets

METHOD FOR PIECEWISE HIERARCHICAL SEQUENTIAL VERIFICATION

TECHNICAL FIELD

The present invention relates to circuit verification tools, specifically to enhancing formal sequential equivalence verification tools.

BACKGROUND ART

This disclosure describes the verification of complex circuit designs using a novel approach. The capability of Sequential Equivalence Checking (SEC) tools is enhanced by designing a process with the weaknesses of SEC tools in mind.

SEC is a PSPACE-complete problem, meaning that the best possible algorithms have exponential run times in the worst case; hence, SEC tools can be expected to run into capacity issues frequently. Yet the power of these tools is immense as they allow verifying sequential optimizations of complex designs with a confidence that cannot be achieved using traditional simulation-based verification. The process described in this disclosure is scalable and can be used to verify much more complex designs than would otherwise be possible, provided the majority of the logic edits can be verified in a stand-alone manner and logic edits that need to be promoted to higher levels of hierarchy are minimal.

Intrinsity, Inc, (Intrinsity), the assignee of this disclosure, is a fabless semiconductor company whose operations include optimizing a customer's RTL (Register Transfer Level) code. Optimizations for higher speed and/or lower power are achieved either by changing the existing RTL, or by re-implementing portions of the design in different types of logic. The design is verified with simulation and formal verification tools.

SEC, a type of formal verification tool, has a lower processing capacity than required for current and future complex designs. By breaking the problem of sequentially verifying a circuit into a series of steps, larger circuits can be verified than would otherwise be possible.

For formal verification, conventional combinational logical equivalence checking (LEC) is usually not possible due to the types of logic changes being made. Combinational LEC tools require a one-to-one correspondence between the state holding elements (flops and latches) of the two designs. Some examples of changes that break this correspondence include:

1 Retiming by moving logic across latch boundaries
2. Recoding of state machines
3. Clock gating
4. Pipeline stage insertion/removal
5. Resource Allocation SEC differs from regular combinational LEC in that sequential elements in the design are not assumed to correspond. Thus, for the types of changes described above, SEC can be used to prove equivalence of designs that LEC would not be able to prove. The trade off is that SEC algorithms are more difficult and require greater computational resources than regular LEC algorithms.

For SEC, the computational resources needed to prove equivalence between two integrated circuits is exponentially related to the size of the integrated circuit as well as the number and type of logic changes between the semiconductor designs. Thus, formally proving the reference RTL equivalent to the design for a large design, or a design with multiple complex changes, can easily create a problem beyond the capacity of current SEC tools. Sequential equivalence checking is an active area of research.

Several techniques simplify the problems presented for formally verifying larger semiconductor designs:

1. Limiting the number of logic changes or edits being proven at any one time. While this technique would be obvious to anyone skilled in the art, the novelty of our method involves organizing these edits to automate checking so that dependent edits are not checked until after those edits upon which they depend.
2. Dividing or partitioning the semiconductor design into smaller sub-blocks that are more easily handled by the tools. Although this technique would also be obvious to anyone skilled in the art, the novelty of our method is being able to determine automatically whether the partition chosen in which to verify a group of edits might result in a false pass of equivalence.
3. Using black boxes to limit the amount of logic that needs to be considered by the verification tool. This use of black boxes is a well-known technique. The novelty of our method is in associating a set of black box modules with individual groups of edits and verifying that the use of such black boxes does not introduce any false passes.
4. Using input constraints when verifying within a partition that does not constitute the entire design. Without input constraints, some circuits may not prove to be equivalent because they differ under input combinations that are unrealizable within the design. Note that using an input constraint creates a proof obligation to verify that the constraint is upheld within an enclosing partition. The use of input constraints for verifying partial designs is a well-known technique. The novelty of our method comes from enforcing the obligation of proving input constraints within some enclosing module that generates the constrained inputs to prevent reporting a false pass.

The solution presented in this disclosure combines these methods, resulting in simpler problems to be solved by the sequential equivalence checker. These techniques scale well with the size of the semiconductor design.

However, these techniques also leave room for human error that can invalidate the overall proof of equivalence. The major purpose of this invention is to create a method that eliminates the sources of human error that would invalidate the overall proof. Here are some sources of human error:

1 Failure to do equivalence checking for every group of edits.
2. Attempting to prove an edit without having the prerequisite conditions for the edit to become effective.
3. Attempting to prove an edit within a partition that does not contain all the modules affected by it.
4. Attempting to use as a black box a module which is affected by the edit being proved.
5. Failure to verify that the reference design is equivalent to the modified design with all edits disabled.
6 Failure to prove that all input constraints for a partition are upheld within its enclosing partition.

SUMMARY OF INVENTION

This invention is a method for accomplishing sequential logical equivalence verification using a hierarchical piecewise approach to avoid problems that are computationally intractable for sequential logical equivalence verification tools. This accomplishment is only possible by severely limiting the number of changes presented to sequential logical equivalence verification tools at any one time, but doing so in a manual fashion is very error-prone. This invention teaches how to automate limiting the number of changes so as to ensure that the composition of the individual proofs of equivalence constitutes a proof of the global equivalence of two designs. This method starts by providing a reference semiconductor design, a second semiconductor design with logic edits relative the reference semiconductor design and submitting to formal verification to check the reference design against the second semiconductor design with all edits disabled (Box 200). It then partitions the semiconductor design into a set of partitions (Box 202) and associates with each partition a set of input constraints (Box 204). The edits are further gathered into groups to limit the number of edits submitted to formal verification (Box 206) and these groups are ordered (Box 208). The invention also discovers a set of dependencies of the logic edits (Box 210) and checks that the ordering of groups obeys the dependencies (Box 212). Each group of edits is further submitted to formal verification (Box 214) and any input constraints assumed for any partitions are verified in their enclosing partition (Box 216). Finally, the method reports success if formal verification succeeds on each group of logic edits and on each set of input constraints (Box 218).

BRIEF DESCRIPTION OF DRAWINGS

To further aid in understanding the disclosure, the attached drawings help illustrate specific features of the disclosure and the following is a brief description of the attached drawings.

DISCLOSURE OF EMBODIMENTS

This disclosure describes a method for piecewise hierarchical sequential verification. This disclosure describes numerous specific details in order to provide a thorough understanding of the present invention. One skilled in the art will appreciate that one may practice the present invention without these specific details. Additionally, this disclosure does not describe some well known items in detail in order not to obscure the present invention.

Figure 1:
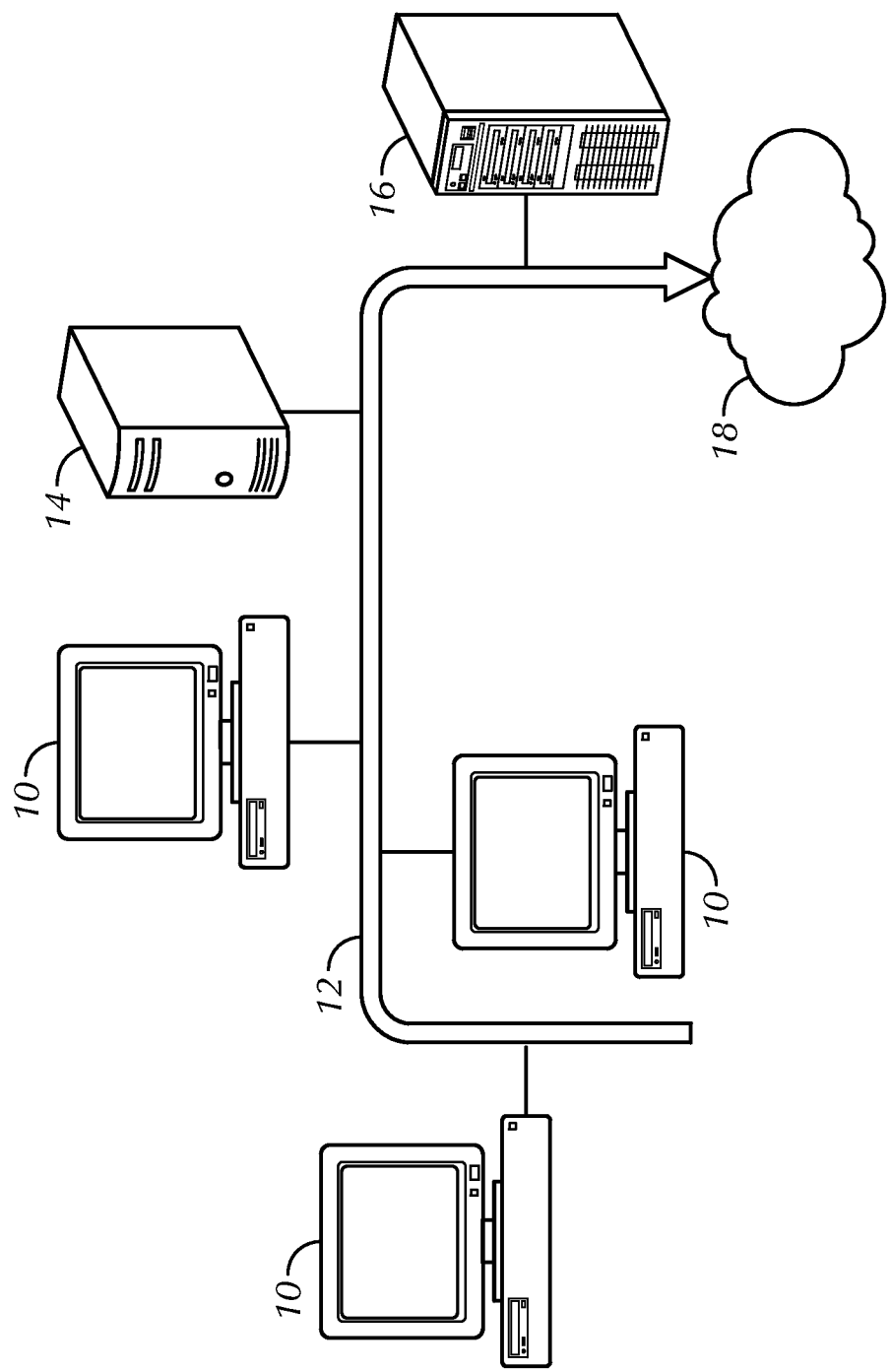
FIG. 1 illustrates the invention in a typical networked environment.

FIG. 1 illustrates the use of the present invention in a typical networked environment. The invention is a software program that runs on one or more workstations 10 in a networked environment. The various workstations 10 couple to a network 12 where they may communicate with each other. Additionally, the networked environment may include a shared storage device 14 and a network server 16. And, the networked environment may couple to the Internet 18. In addition to being able to operate on one or more workstations 10, the invention may use the resources of the shared storage device 14 and the network server 16. The invention may also use resources available through the Internet 18. One embodiment of the invention uses a LINUX based standalone workstation 10 and uses the interpretive language PERL and TCL. One skilled in the arts will appreciate the invention is capable of using other languages for operation and that it may be hosted on other operating systems.

Figure 2:
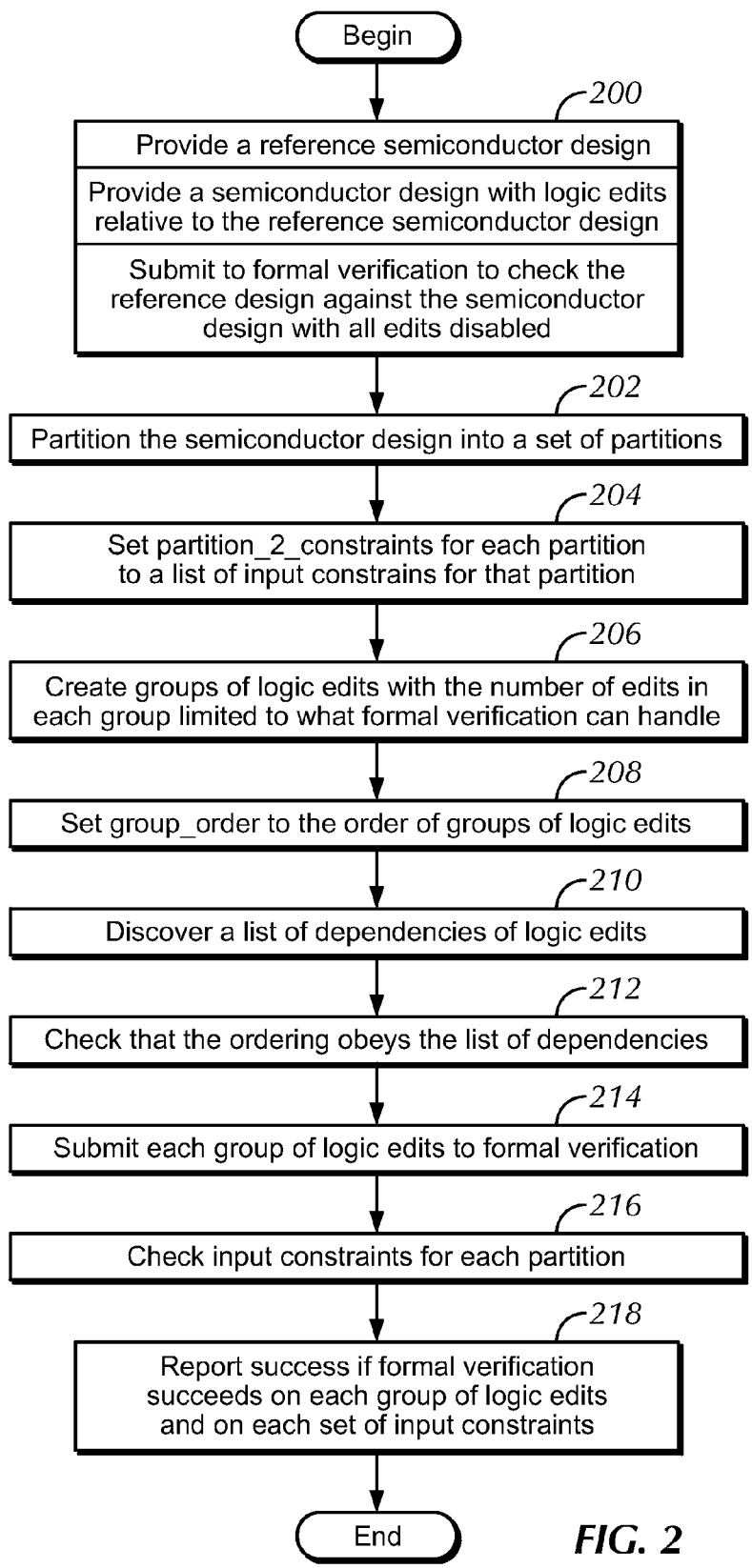
FIG. 2 illustrates the top-level flow chart of our method.

In FIG. 2, we illustrate the top-level flow chart of our method. Box 200 provides a reference semiconductor design and a second semiconductor design that differs from the reference semiconductor design by having some number of edits inserted in such a way as to be conditionally compiled. In one embodiment of our invention, sections that constitute edits have the form:

```
`ifdef EDIT_A_OFF
    // Original Verilog code for edit A
`else
    `ifdef EDIT_B_OFF
        // Original Verilog code for edit B
    `else
        // Edited Verilog code for edit B
    `endif
    // Edited Verilog code for edit A
`endif
```

In this example, Edit B is dependent upon Edit A by virtue of being nested within the 'else block of Edit A. Box 200 further submits to formal verification to check the reference design against the semiconductor design with all edits disabled. This initial check establishes a baseline and insures against edits that were mistakenly made outside the 'ifdef blocks.

In an embodiment of our invention that supports partitioning the semiconductor design into a set of partitions corresponding to hierarchical boundaries within the design, we partition the design as illustrated in Box 202. For an embodiment of our invention that supports input constraints, for each partition p that is not the top-level partition, we set partition_2_constraints for partition p to contain a list of input constraints as illustrated in Box 204. Next, in Box 206, we group the logic edits into sets with a number of edits limited to what formal verification can handle. This step generally requires a degree of engineering judgment. Then, in Box 208, we order the groups of logic edits, setting list group_order to the resulting order. In one embodiment of our invention, the ordering is provided manually, but one may readily imagine an embodiment where the ordering is computed. Proceeding to Box 210, we discover the dependencies of the logic edits using the method of FIG. 3. However the ordering in Box 208 is generated, we next check in Box 212 that it obeys the list of dependencies discovered in Box 210 using the method of FIG. 14. Following this step, we submit each group of edits to formal verification in Box 214 using the method of FIG. 18. In an embodiment of our invention that supports input constraints for partitions, Box 216 then checks that the input constraints for each partition are obeyed within its enclosing partition using the method of FIG. 19. Finally, in Box 218, we report success if each of the logic edits verified successfully in Box 214 and if each set of input constraints verified successfully in Box 216; otherwise we report failure.

Figure 3:
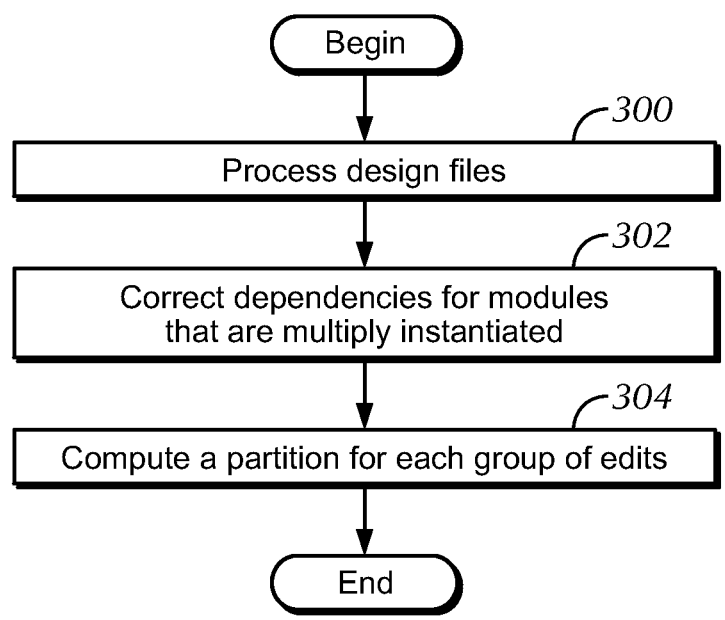
FIG. 3 illustrates the method of Box 210 of FIG. 2.

FIG. 3 illustrates the method of Box 210 of FIG. 2. In Box 300, we process all the files associated with the semiconductor design using the method illustrated in FIG. 4. Next, Box 302 corrects the dependencies to account for modules that are multiply instantiated using the method of FIG. 7. Finally, in an embodiment that supports partitioning of the semiconductor design, we compute in Box 304 an appropriate partition for each group of edits of the design using the method of FIG. 11.

Figure 4:
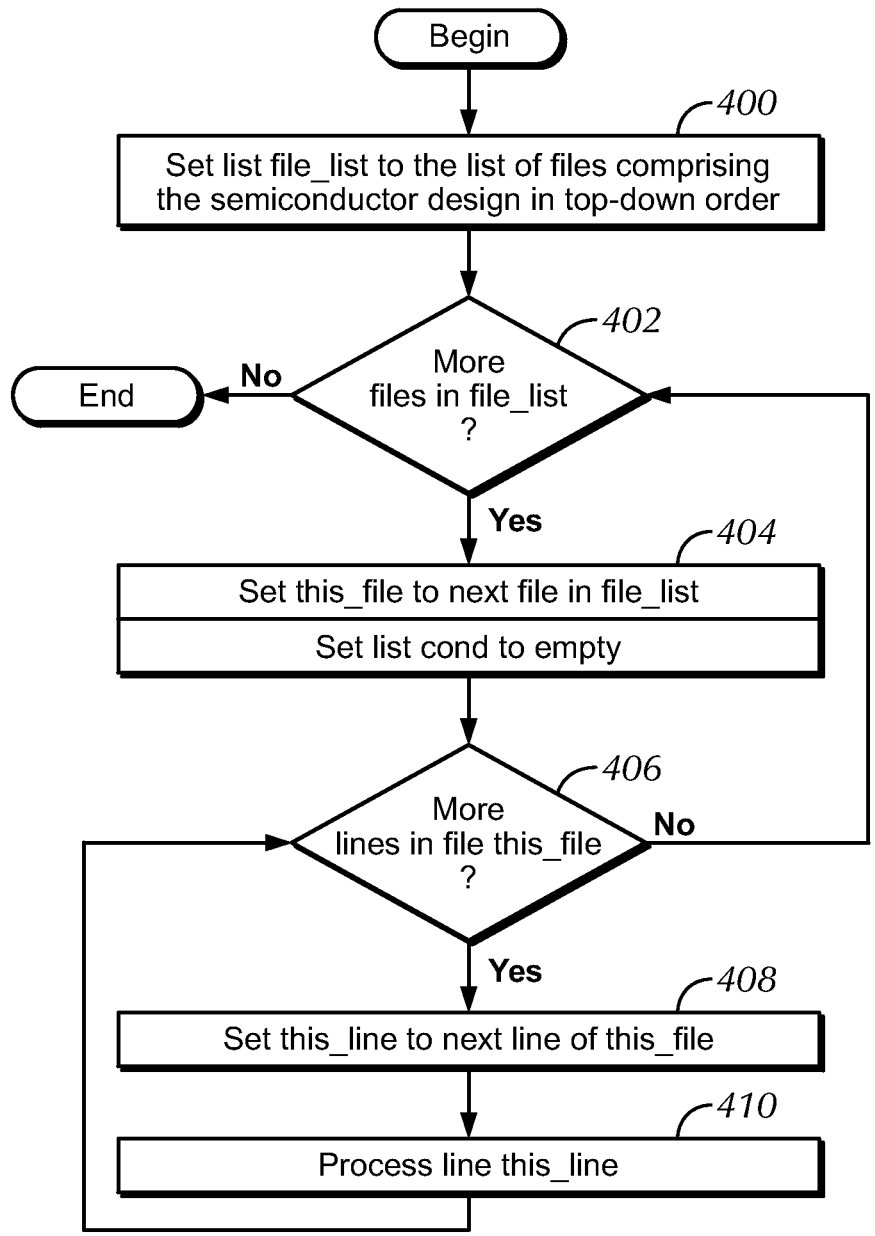
FIG. 4 illustrates the method of Box 300 of FIG. 3.

In FIG. 4, we illustrate the method of Box 300 of FIG. 3. This method processes the semiconductor design files to compute the following associations:

edit_2_module
  Given the name of an edit, gives a list of modules impacted by that edit.
module_2_edit
  Given the name of a module, gives a list of edits impacting that module.
edit_requires
  Given the name of an edit, gives a list of conditions required as a precondition for testing a group of edits, where a condition is a list of "e is on" or "e is off" for some set of edits "e".
condition_defines(condition_undefs)
  Given a condition, gives a list of edits with 'define ('undef) within that condition.
mod_parents
  Given a module name, gives a list of modules that instantiate that module.
mod_count
  Given a module name, gives the total number of instances of that module within the design.

The method starts in Box 400 which sets list file_list to contain the list of files comprising the semiconductor design in some top-down order so that parent modules are processed before child modules. Then, in Box 402, we ask if there are more unprocessed files in file_list. If not, we are done; otherwise, we go to Box 404, where we set this_file to the next unprocessed file in file_list and initialize list cond to be empty. Next, Box 406 asks whether there are more unprocessed lines in file this_file. If not, we return to Box 402 to process the next file; otherwise we proceed to Box 408. There, we set this_line to the next line of file this_file. Finally, we proceed to Box 410 which uses the method of FIG. 5 to process the line contained in this_line, after which control returns to Box 406 to process the next unprocessed line.

Figure 5:
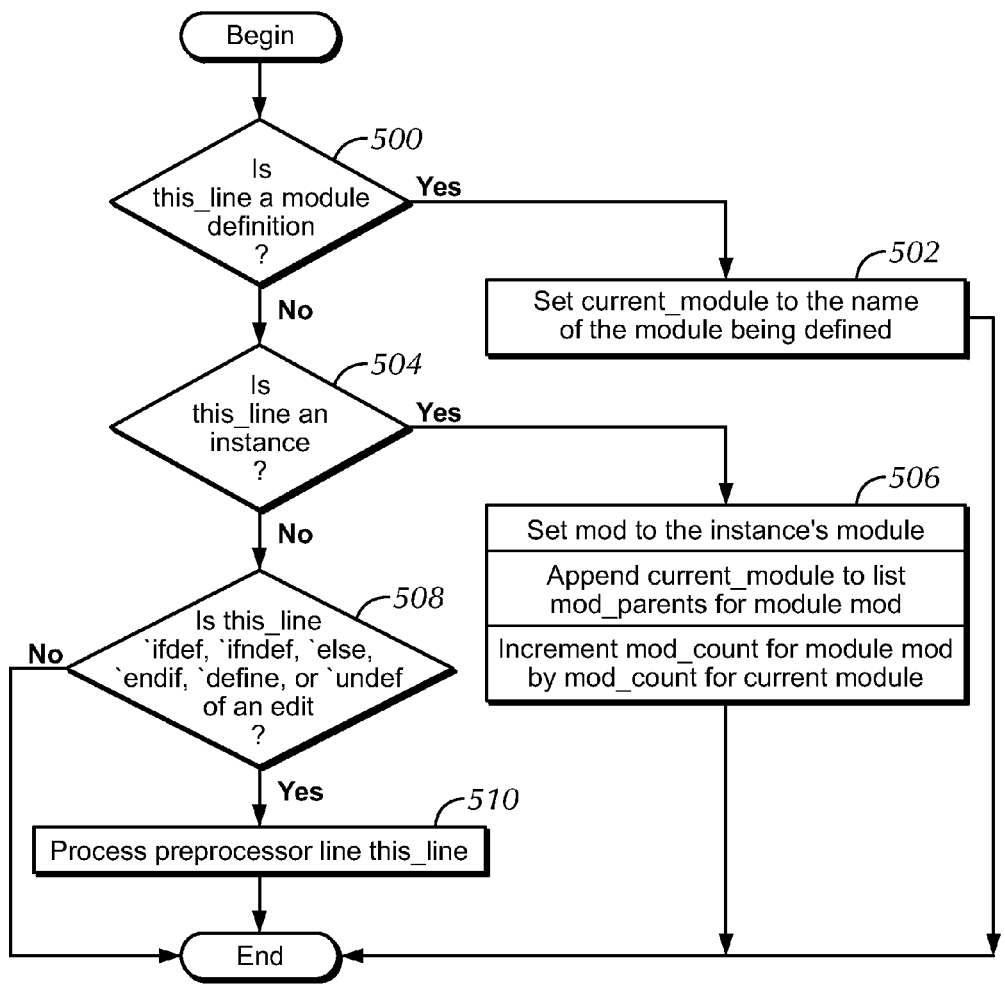
FIG. 5 illustrates the method of Box 410 of FIG. 4.

In FIG. 5, we illustrate the method of Box 410 of FIG. 4. This method starts in Box 500 which queries whether this_line is a module definition. If it is, we execute Box 502, which sets current_module to the name of the module being defined and exit; otherwise we go to Box 504, which asks if this_line is an instance. If so, we go to Box 506, which sets mod to the module which this_line instances, appends module current_module to list mod_parents for module mod, increments mod_count for module mod by mod_count for the current module, and exits; otherwise we go to Box 508. Here, we query whether the line contained in this_line is a preprocessor statement related to turning on or off a design edit. If it is not, we exit; otherwise we advance to Box 510 to process the preprocessor line this_line using the method of FIG. 6 and then exit.

Figure 6:
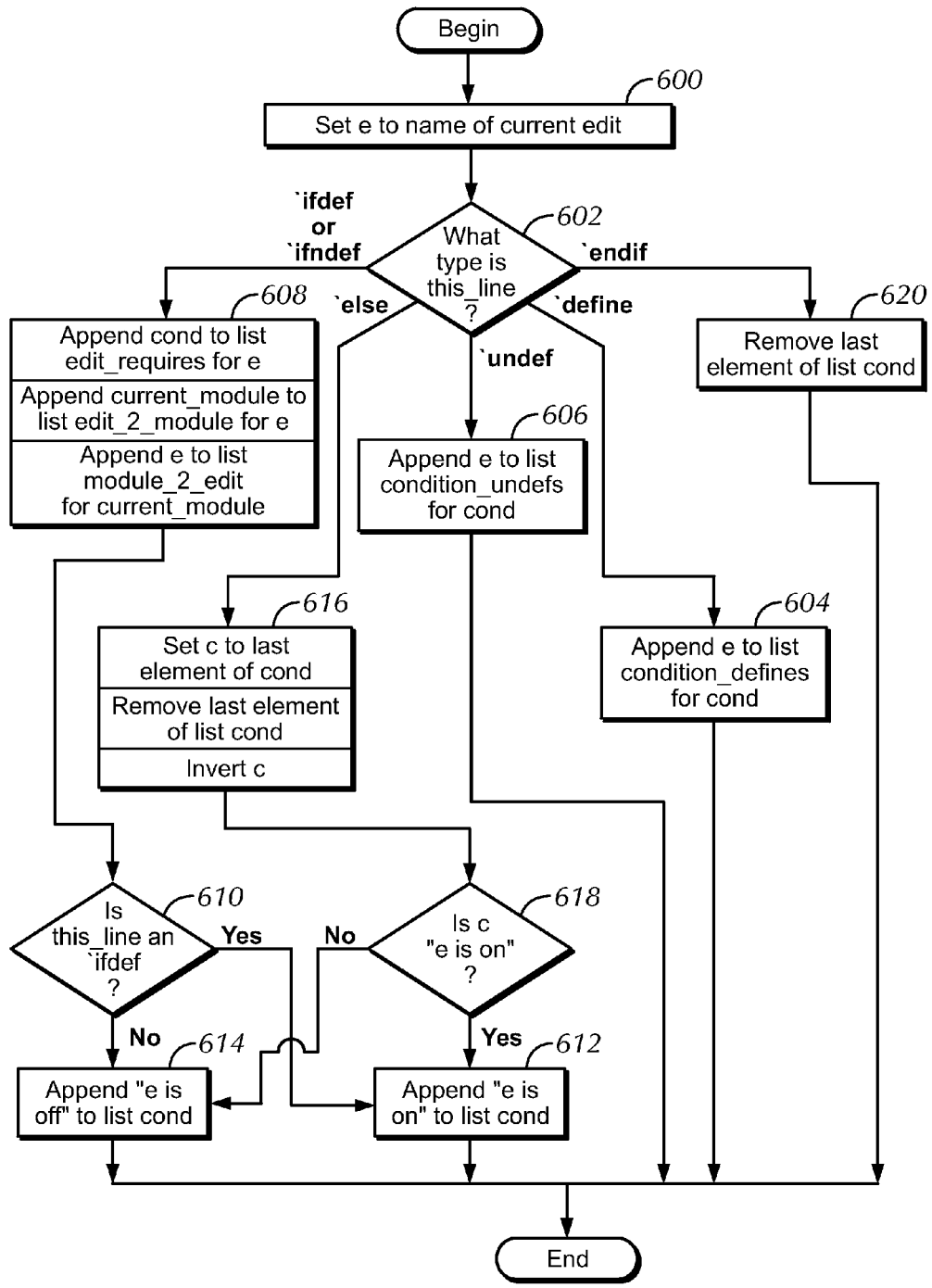
FIG. 6 illustrates the method of Box 510 of FIG. 5.

FIG. 6 illustrates the method of Box 510 of FIG. 5. This method begins in Box 600, which sets e to the name of the edit involved in the preprocessor statement. Then control proceeds to Box 602, which switches based upon what type of preprocessor statement this_line is. If this_line is a 'define, we go to Box 604 to append e to list condition_defines for condition cond and exit. Similarly, if this_line is an 'undef, we go to Box 606 to append e to list condition_undefs for condition cond and exit. If this_line is an 'ifdef or an 'ifndef, we proceed to Box 608, which appends cond to list edit_requires for edit e, appends module current_module to list edit_2_module for edit e, and appends e to list module_2_edit for module current_module. We then proceed to Box 610, which asks whether this_line is an 'ifdef. If it is, we proceed to Box 612 to append "e is on" to list cond and exit; otherwise we go to Box 614 to append "e is off" to list cond and exit. If this_line is 'else from Box 602, we go to Box 616, which sets c to the last element of list cond, removes the last element of list cond and inverts c so that "e is on" becomes "e is off" and vice versa. We then advance to Box 618, which asks if the now inverted c is "e is on". If it is, we go to Box 612, otherwise we go to Box 614. Finally, if this_line is 'endif from Box 602, we go to Box 620, which removes the last element from list cond and exits.

Figure 7:
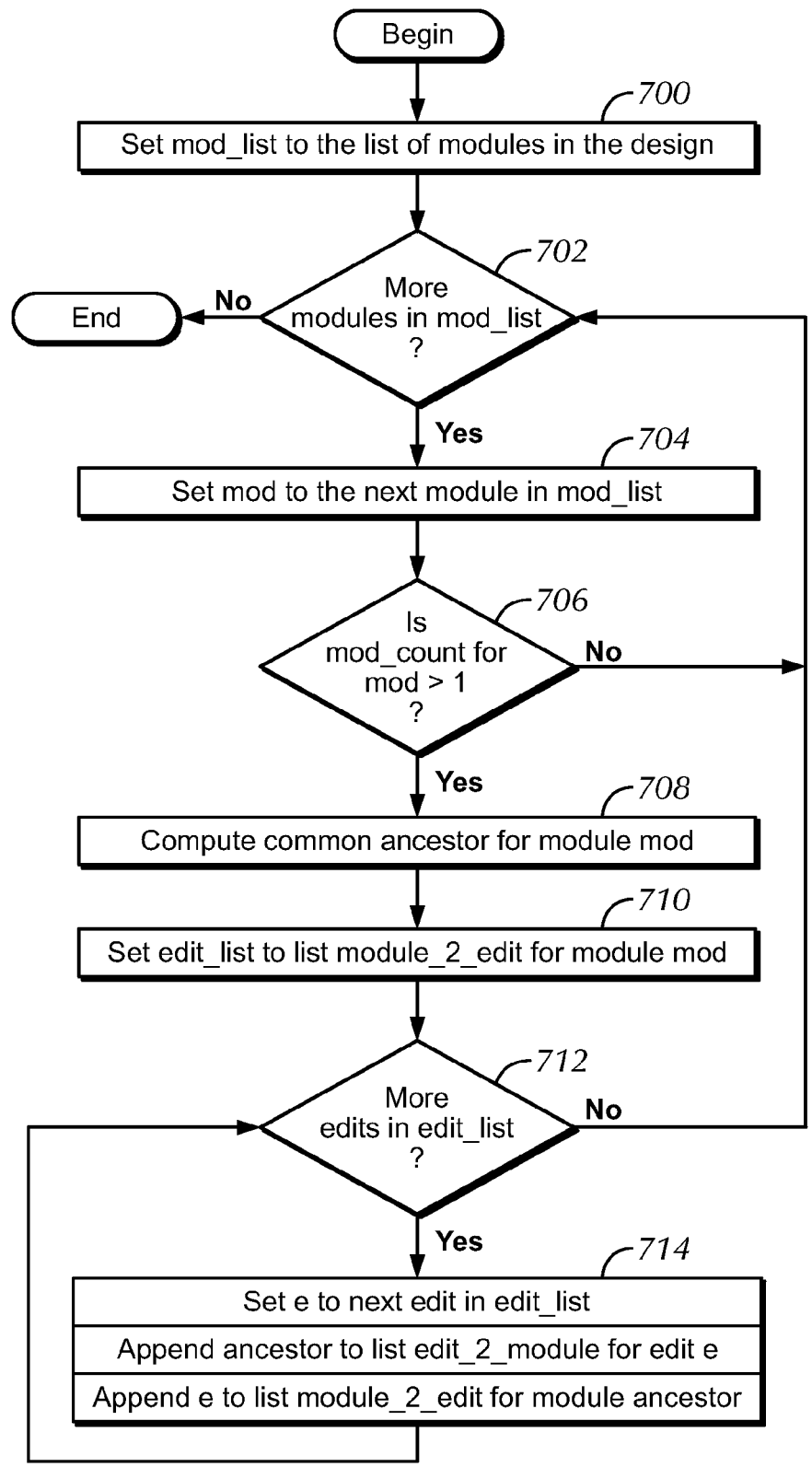
FIG. 7 illustrates the method of Box 302 of FIG. 3.

FIG. 7 illustrates the method of Box 302 of FIG. 3. It starts in Box 700 by setting list mod_list to the list of modules comprising the design and moves to Box 702, which asks whether there are more unprocessed modules in list mod_list. If there are not, we are done; otherwise we go to Box 704, which sets mod to the next unprocessed module in list mod_list. Next, Box 706 checks whether there are multiple instances of module mod within the design by checking whether the value of mod_count for module mod is greater than 1. If it is not, control returns to Box 702 to examine the next module; otherwise we proceed to Box 708, which uses the method of FIG. 8 to compute into ancestor the module which is the common ancestor of all the instances of module mod. Then we set list edit_list to list module_2_edit for module mod in Box 710 and advance to Box 712 to determine if there are any unprocessed edits in list edit_list. If there are not, we return to Box 702; otherwise, we go to Box 714. Here, we set e to the next unprocessed edit in list edit_list, append the common ancestor ancestor to list edit_2_module for edit e and append e to list module_2_edit for module ancestor before going back to Box 712.

Figure 8:
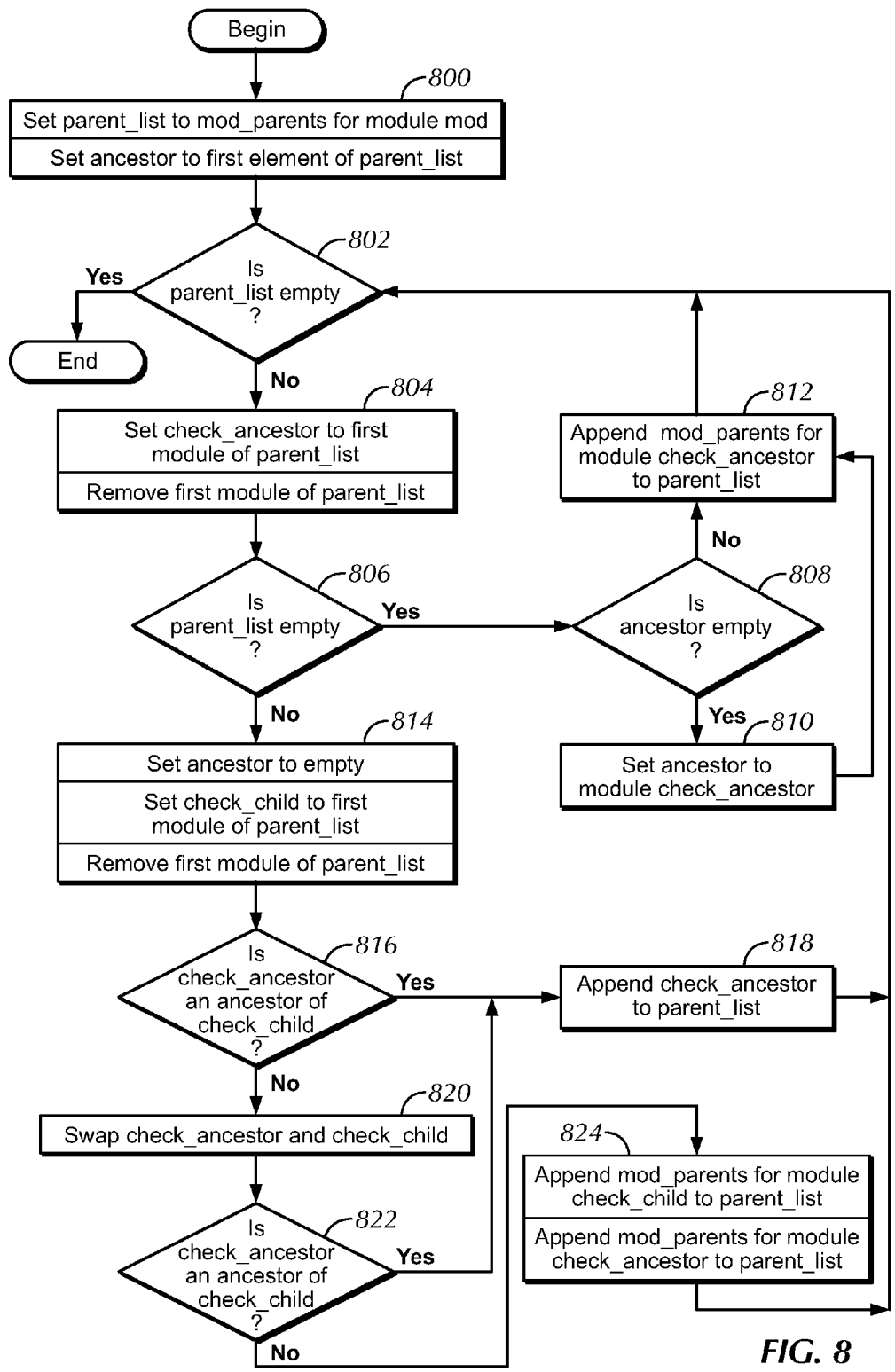
FIG. 8 illustrates the method of Box 708 of FIG. 7.

The method of Box 708 of FIG. 7 is illustrated in FIG. 8. The purpose of this method is to find the lowest common ancestor of all the instances of a module mod, given that we know what the parents of each module are. At the bottom of the search space, there is a single module mod and at the top of the graph there is a single module, the root of the hierarchy. Thus, the space we need to search can be viewed as one or more subgraphs that fork from a single node and join back to a single node separated by chains of single nodes, with chains at the bottom and top of the graph extending to module mod and the root of the hierarchy, respectively. The ancestor we want is the join point for the last chain, the one leading to the root of the hierarchy. This method works by keeping track in ancestor of the join points and creating a list parent_list to traverse the chains and to follow the fork/join subgraphs along all paths to find the next join point. This process is illustrated schematically in FIG. 9.

This method starts in Box 800 which initializes list parent_list to be list mod_parents for module mod and sets ancestor to be the first element of list parent_list. List parent_list will not initially be empty, since we do not use this method unless module mod has at least two instances. Then we ask in Box 802 whether list parent_list is empty. If it is, we have tracked to the root of the hierarchy and we are done; otherwise we proceed to Box 804, which sets check_ancestor to the first module of list parent_list and removes that same first module from list parent_list. Next, we again check whether list parent_list is empty in Box 806. If it is, there was only one element in list parent_list meaning that check_ancestor is within one of the chains, so we proceed to Box 808; otherwise we go to Box 814. In Box 808, we ask whether ancestor is empty. If so, check_ancestor is the join point of a chain, so we set ancestor to module check_ancestor in Box 810 and proceed to Box 812; otherwise we go directly to Box 812, which appends list mod_parents for module check_ancestor to list parent_list and returns to Box 802 to process the next module in list parent_list.

If we reach Box 814, it means we have reached a fork, so any previously computed join point is not the common ancestor we want. Accordingly, we set ancestor to empty, set check_ child to the first module of list parent_list and then remove that same first module of list parent_list. Next, Box 816 queries whether module check_ancestor is an ancestor of module check_child using the method of FIG. 10. If it is, we ignore check_child, since it cannot be the join point, and go to Box 818 to append check_ancestor, which may be the join point, to list parent_list and return to Box 802; otherwise we continue to Box 820 to swap check_ancestor and check_child. Next, Box 822 asks whether module check_ancestor is an ancestor of module check_child using the method of FIG. 10. If so, we go to Box 818; otherwise control advances to Box 824, which appends list mod_parents for module check_child to list parent_list, appends list mod_parents for module check_ancestor to list parent_list and returns Box 802.

Figure 9:
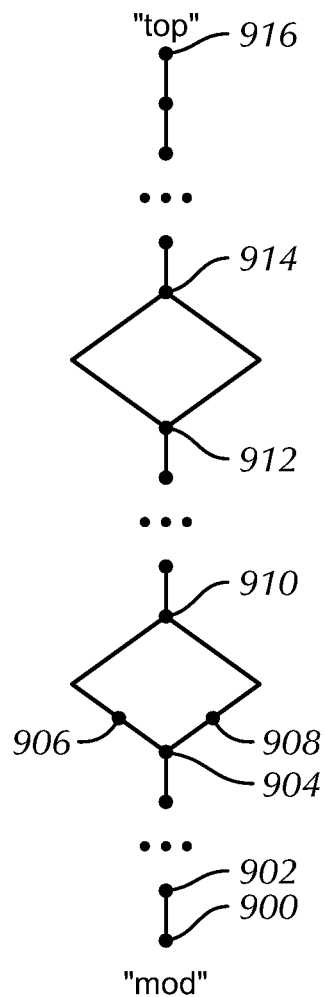
FIG. 9 illustrates a schematic depiction of the method of FIG. 8.

FIG. 9 illustrates a schematic depiction of the method of FIG. 8. In this depiction, the parent modules are above their child modules. The method starts with module mod 900 and initializes parent_list to contain its parent module 902 and sets it to be the potential ancestor. For as long as we are in the chain containing mod, there is only be one element in parent_list in Box 802, so we take the branch to Box 808. Eventually, we either reach a fork point 904 or 902 was the ancestor which contains all instances of mod. The chain preceding a fork could without loss of generality have zero length, in which case mod is itself a fork point. Once fork point 904 is reached, parent_list is set in Box 812 to have multiple elements 906, . . . , 908. At this point, the method of FIG. 8 takes the branch to Box 814, which processes the first two elements from parent_list. If either is an ancestor of the other, the ancestor is appended back to parent_list and the other is discarded. If neither is an ancestor of the other, then the parents of both modules are appended to parent_list. Eventually, one of the paths reaches the join point 910, at which point all the other elements are eventually removed from parent_list by the join point, leaving it as a single element in parent_list. The method then takes the branch to Box 808 again. Since ancestor is now empty (from Box 814), we set ancestor to the join point 910 before appending its parents to parent_list and track up the next chain (which may without loss of generality also have zero length). Eventually, after some arbitrary number of fork and join points, we reach the last fork point 912 and set ancestor to the last join point 914. Tracking up the last chain, possibly of zero length, leads to the top of the hierarchy 916, after which the algorithm terminates since parent_list becomes empty. The last join point 914, stored in ancestor, is the common ancestor of all instances of module mod.

Figure 10:
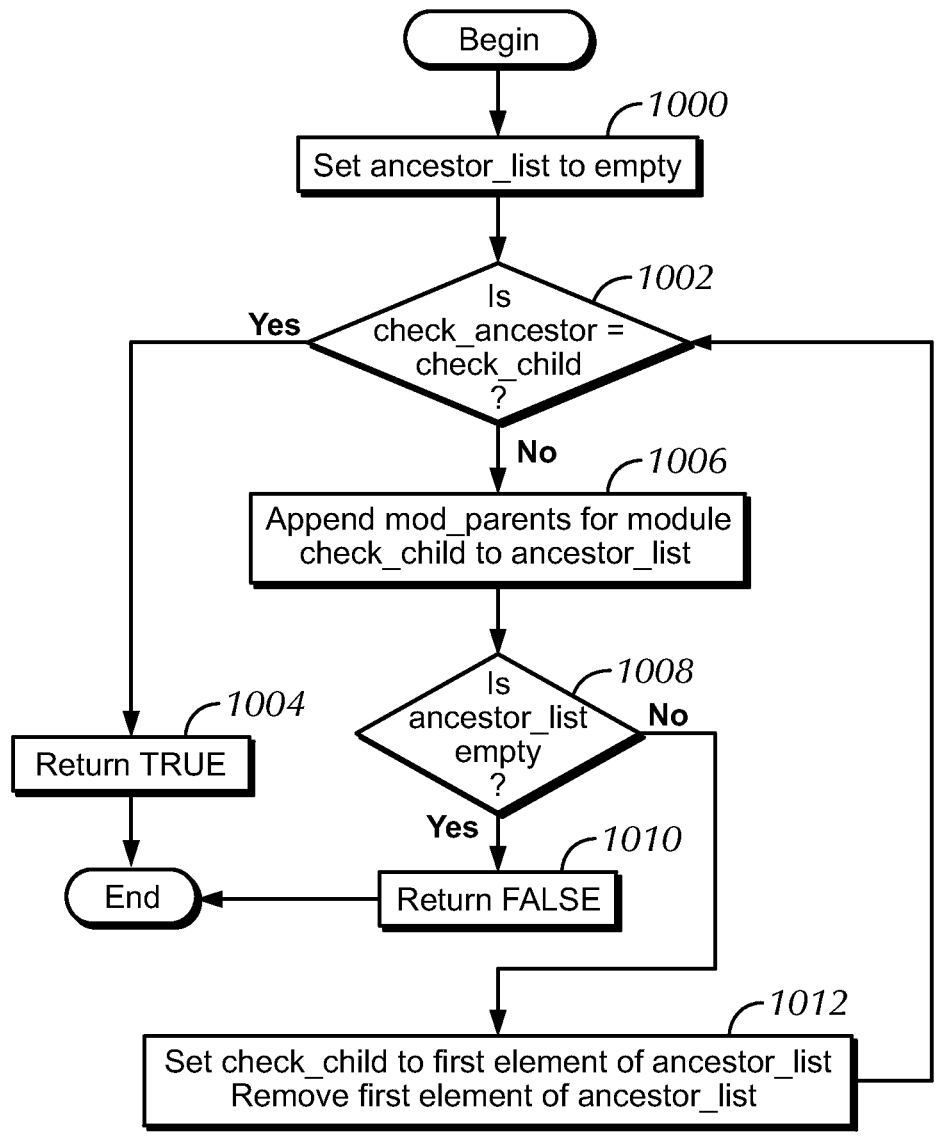
FIG. 10 illustrates the method of Box 816 of FIG. 8, Box 822 of FIG. 8, Box 1210 of FIG. 12, Box 1314 of FIG. 13, Box 2110 of FIG. 21, and Box 2118 of FIG. 21.
Figure 12:
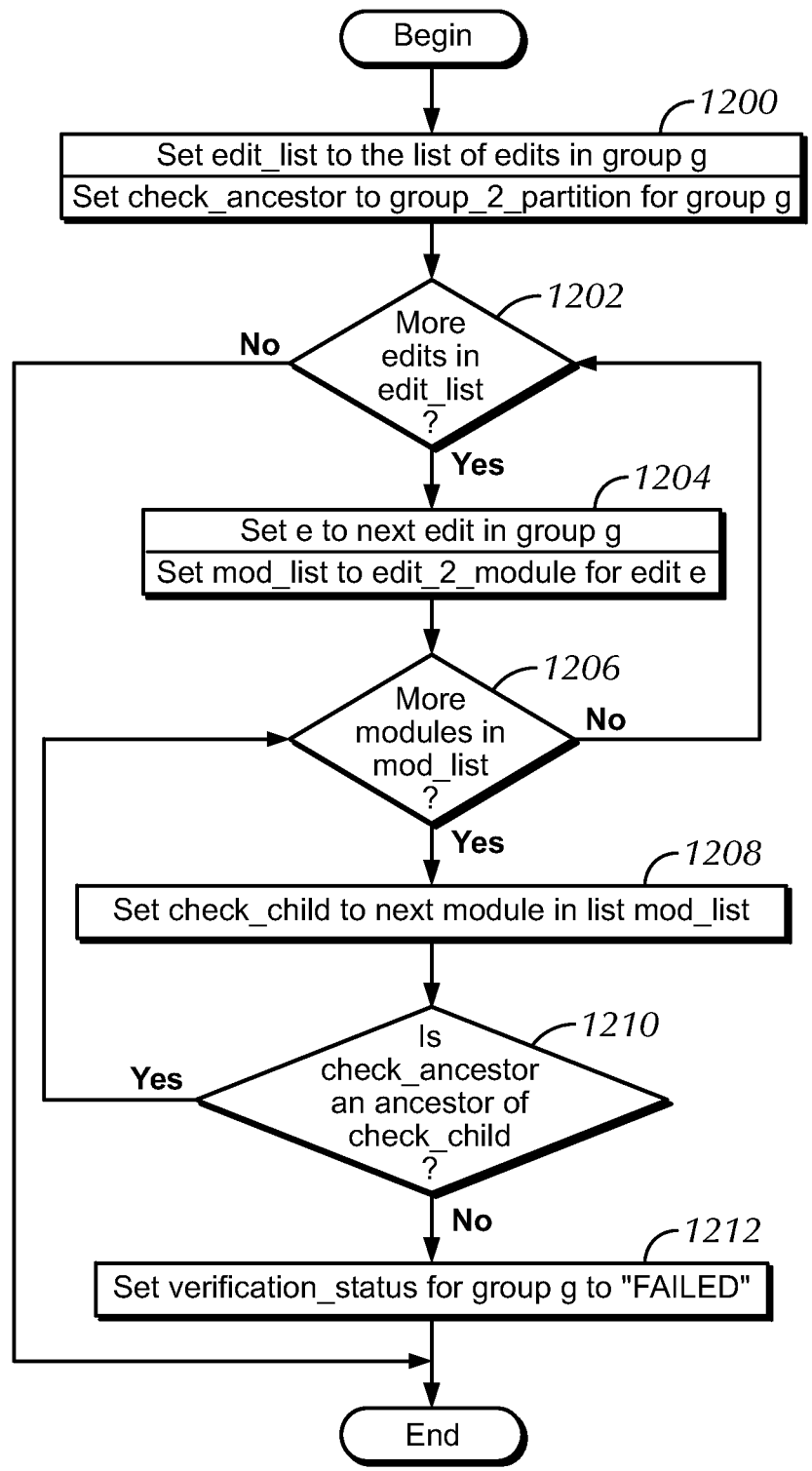
FIG. 12 illustrates the method of Box 1106 of FIG. 11.
Figure 13:
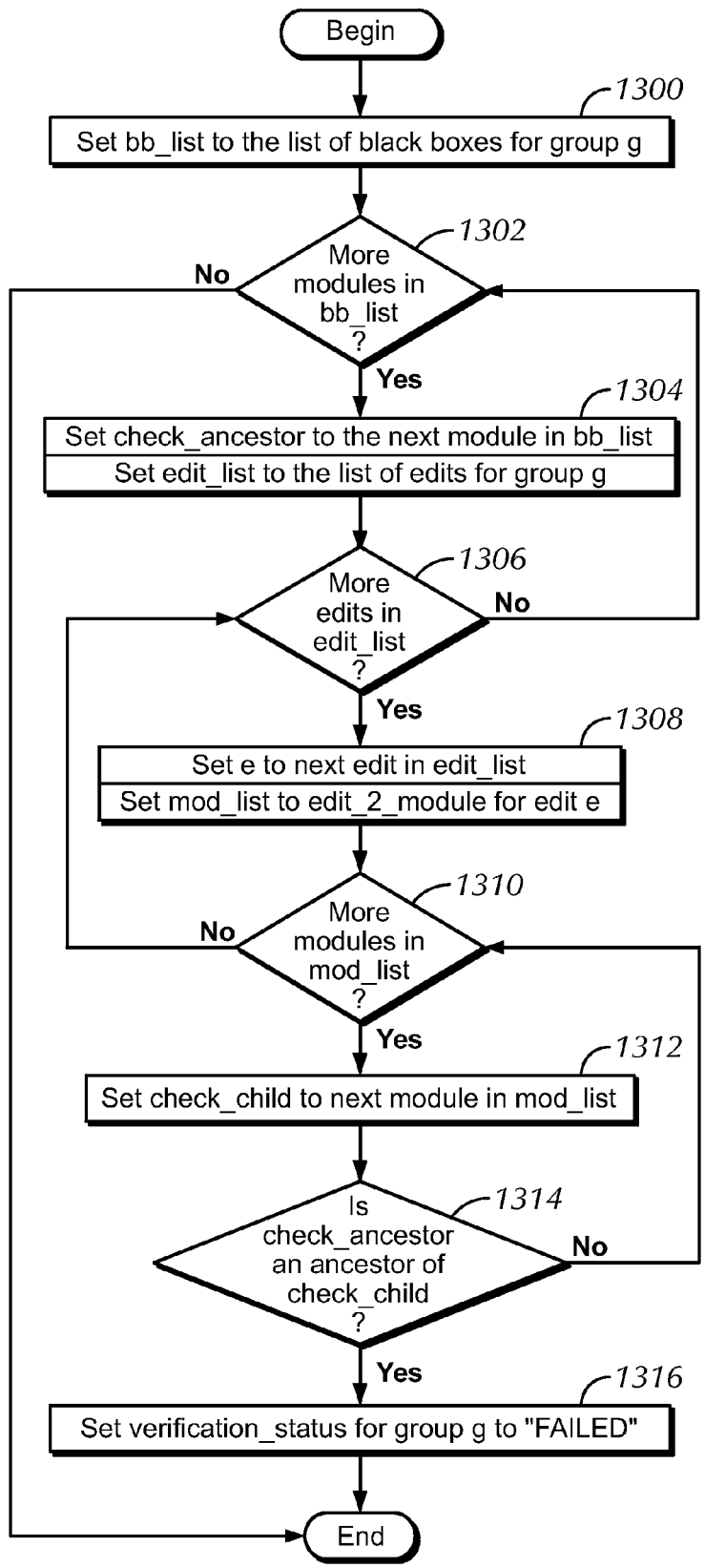
FIG. 13 illustrates the method of Box 1108 of FIG. 11.
Figure 21:
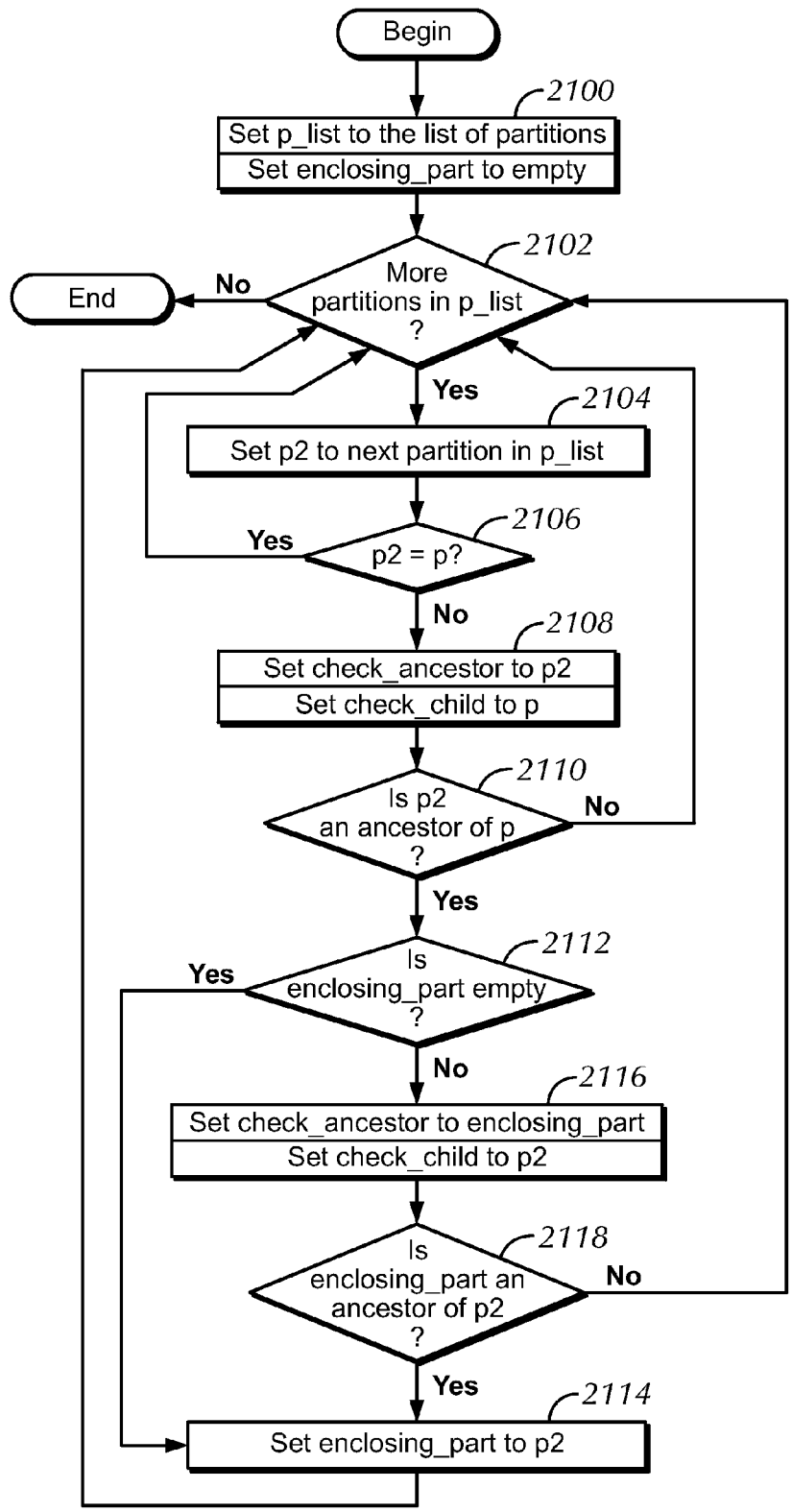
FIG. 21 illustrates the method of Box 1906 of FIG. 19.

FIG. 10 illustrates the method of Box 816 of FIG. 8, Box 822 of FIG. 8, Box 1210 of FIG. 12, Box 1314 of FIG. 13, Box 2110 of FIG. 21, and Box 2118 of FIG. 21. It starts in Box 1000 by initializing list ancestor_list to empty and then proceeds to Box 1002 which asks if check_ancestor is equal to check_child. If it is, then we go to Box 1004 which returns TRUE and exits; otherwise we advance to Box 1006, which appends the list mod_parents for module check_child to list ancestor_list. Next, Box 1008 queries whether list ancestor_list is empty. If it is, we have traced from check_child to the root of the hierarchy without encountering check_ancestor, so we go to Box 1010 where we return FALSE and exit; otherwise we proceed to Box 1012. Here, we set check_child to the first element of list ancestor_list, remove the first element of list ancestor_list, and return to Box 1002.

Figure 11:
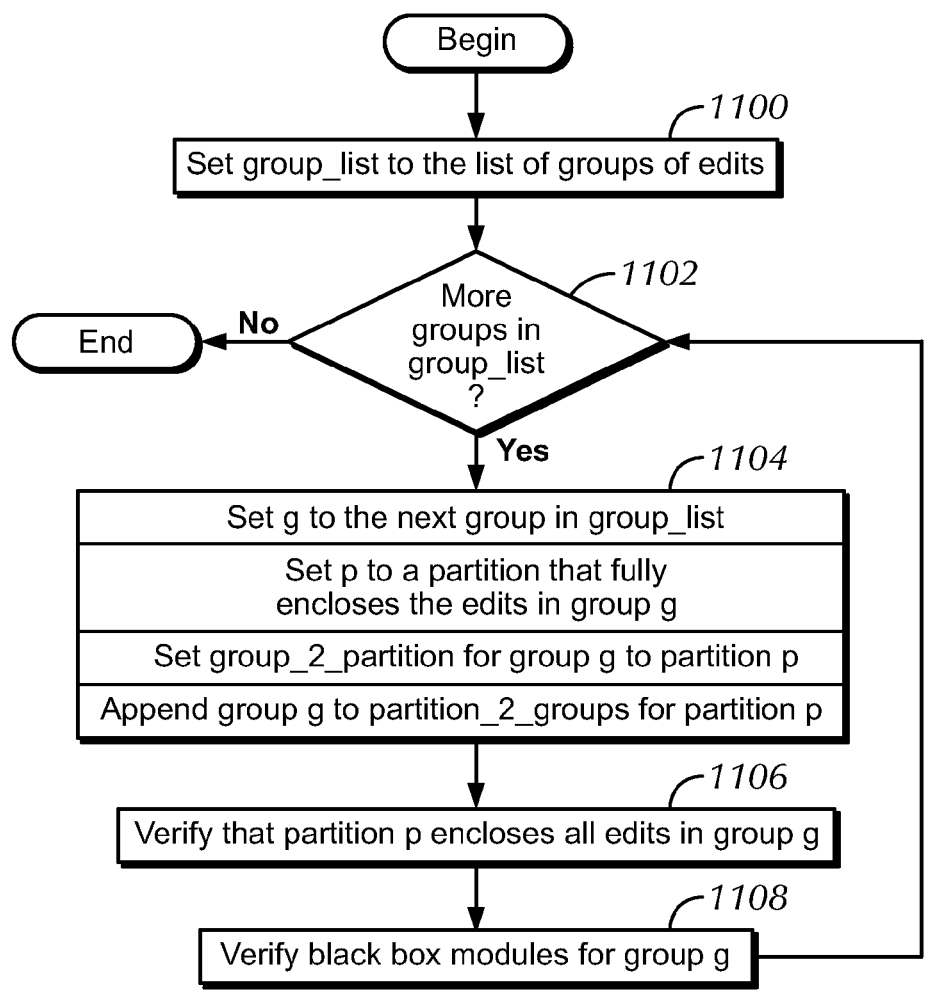
FIG. 11 illustrates the method of Box 304 of FIG. 3.

In FIG. 11, we illustrate the method of Box 304 of FIG. 3. First, Box 1100 sets list group_list to the list of groups of edits identified in Box 206 of FIG. 2. Next, we ask in Box 1102 if there are more unprocessed groups in list group_list. If there are not, we are finished; otherwise, we move to Box 1104. Here, we set g to the next unprocessed group in list group_list, set p to a partition that fully encloses the edits in group g, set group_2_partition for group g to partition p and append group g to list partition_2_groups for partition p. In one embodiment of our invention, partition p is selected for group g manually, but it is easy to envision an embodiment that automatically chooses for group g the minimal partition that encloses all of its edits. To avoid errors in an embodiment of our invention where the partition is selected manually, we proceed to Box 1106, which verifies that partition p actually encloses all the edits of group g using the method of FIG. 12. Finally, for an embodiment of our invention that allows a list of modules to be considered as black boxes for group g, we verify in Box 1108 that the modules to be black boxes do not contain any of the edits in group g using the method of FIG. 13 before returning to Box 1102 to process the next group of edits.

FIG. 12 illustrates the method of Box 1106 of FIG. 11. Beginning in Box 1200, it sets edit_list to the list of edits in group g and sets check_ancestor to module group_2_partition for group g before advancing to Box 1202. Here, we ask if there are any unprocessed edits in edit_list. If not, we are done; otherwise, we proceed to Box 1204 which sets e to the next unprocessed edit in group g and sets mod_list to the list edit_2_module for edit e. Next, in Box 1206, we ask if there are any unprocessed modules in mod_list. If there are not, we return to Box 1202 to process the next edit; otherwise, we proceed to Box 1208, which sets check_child to the next unprocessed module in list mod_list. Continuing to Box 1210, we query whether check_ancestor is an ancestor of check_child using the method of FIG. 10. If it is, we return to Box 1206 to check the next module affected by edit e; otherwise we advance to Box 1212. If we are here, it means we have found an edit which affects a module not contained within the partition for group g; accordingly, we set verification_status for group g to "FAILED" and exit.

FIG. 13 illustrates the method of Box 1108 of FIG. 11. Beginning in Box 1300, it sets list bb_list to the list of black box modules for group g. Then it asks in Box 1302 whether there are more unprocessed modules in list bb_list. If not, we are done; otherwise, we continue to Box 1304, which sets check_ancestor to the next unprocessed module in list bb_list and sets list edit_list to the list of edits for group g. Next, Box 1306 queries whether there are more unprocessed edits in list edit_list. If not, we return to Box 1302 to consider the next black box module; otherwise we advance to Box 1308, which sets e to the next unprocessed edit in list edit_list, sets list mod_list to list edit_2_module for edit e, and proceeds to Box 1310. Here, we ask if there are any unprocessed modules in list mod_list. If there are not, control goes back to Box 1306 to process the next edit in group g; otherwise, we go forward to Box 1312, which sets check_child to the next unprocessed module in list mod_list. After this, Box 1314 asks whether check_ancestor is an ancestor of check_child using the method of FIG. 10. If it is not; we return to Box 1310 to examine the next module affected by edit e; otherwise we go to Box 1316. If we reach this box, it means we have found a module affected by an edit within group g and which is contained within a black box module. In this case, we verification_status for group g to "FAILED" in Box 1316 and terminate.

Figure 14:
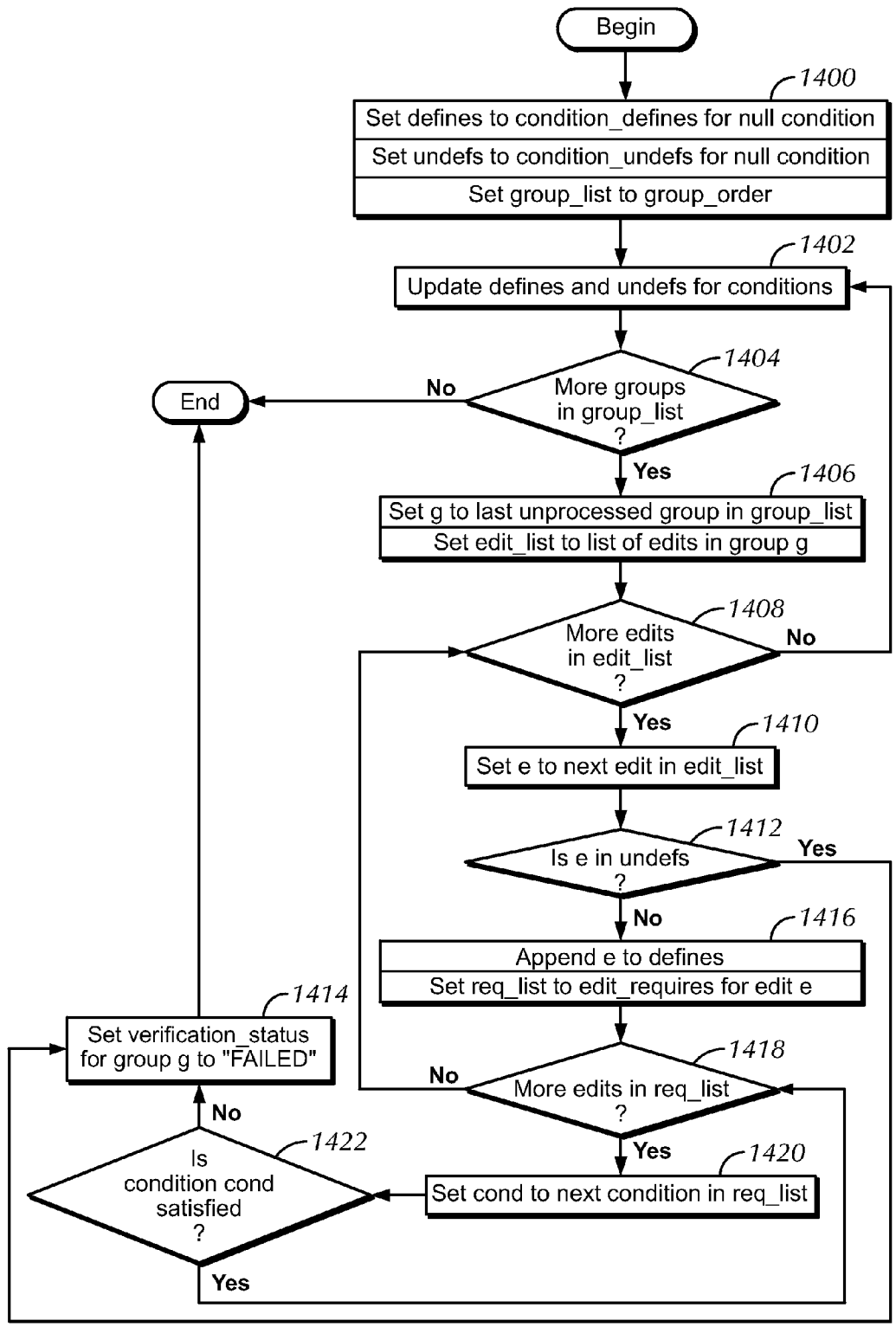
FIG. 14 illustrates the method of Box 212 of FIG. 2.

FIG. 14 illustrates the method of Box 212 of FIG. 2. It starts in Box 1400, which sets list defines to be list condition_defines for the null condition, list undefs to be list condition_undefs for the null condition, and list group_list to be list group_order. In other words, defines (respectively, undefs) contains all those constants that had a 'define (respectively, 'undef) for them in the Verilog code outside of all 'ifdef, 'ifndef or 'else clauses. Next, in Box 1402 we update lists defines and undefs for any 'define or 'undef statements that occur within a condition that is currently valid, using the method of FIG. 15. Proceeding to Box 1404, we ask if there are more groups in list group_list containing the ordering of groups from Box 208 in FIG. 2. If there are no more groups, we are done; otherwise the method goes to Box 1406, which sets g to the last unprocessed group in list group_list and sets edit_list to the list of edits in group g. Note that we process the edit groups in reverse order since the edits are established such that having a 'define for an edit turns it off. After this, we query in Box 1408 whether there are any unprocessed edits in edit_list. If not, we return to Box 1402 to bring the list of defines up to date with respect to any new conditions that have been enabled by the edits in edit_list; otherwise we advance to Box 1410, which sets e to the next unprocessed edit in edit_list. Box 1412 forks based on whether e is in list undefs. If it is, we have no controllability to turn off the edit by defining it, so we go to Box 1414 to set verification_status for edit group g to "FAILED" and exit; otherwise we proceed to Box 1416 which appends e to list defines and sets list req_list to list edit_requires for edit e. Next, Box 1418 asks if there are any more unprocessed conditions in list req_list. If there are not, we return to Box 1408; otherwise, in Box 1420, we set cond to the next unprocessed condition in list req_list. Finally, in Box 1422, we query whether condition cond is satisfied using the method of FIG. 16. If it is not, then the dependency order has not been preserved, so we go to Box 1414 to signal the failure and exit; otherwise, we return to Box 1418.

Figure 15:
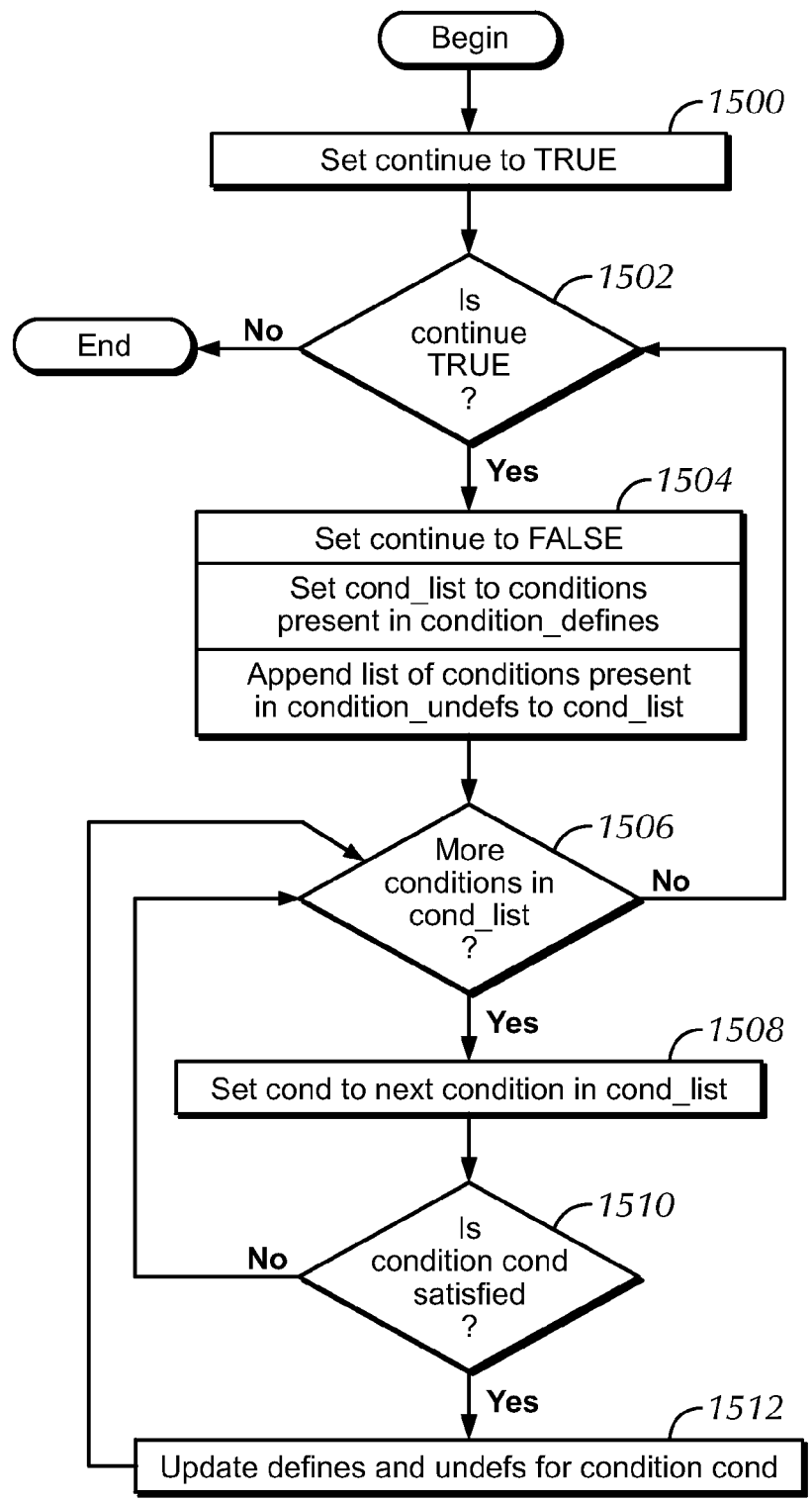
FIG. 15 illustrates the method of Box 1402 of FIG. 14.

FIG. 15 illustrates the method of Box 1402 of FIG. 14. It starts in Box 1500 by setting continue to TRUE, and then advances to Box 1502 to ask if continue is TRUE. Obviously, it will be TRUE the first time we execute Box 1502, but may not be in later iterations. If continue is not TRUE, we are done; otherwise we go to Box 1504, which sets continue to FALSE, and then sets list cond_list to contain the list of conditions in condition_defines that have edits associated with them, appended with the analogous list of conditions for condition_undefs. Next, Box 1506 asks if there are more unprocessed conditions in list cond_list. If there are not, we return to Box 1502 to check whether to stop; otherwise, we set cond to the next unprocessed condition in list cond_list in Box 1508 and progress to Box 1510. Here, we query whether condition cond is satisfied using the method of FIG. 16. If it is not satisfied, we go back to Box 1506; otherwise Box 1512 updates defines and undefs to reflect the fact that cond is true using the method of FIG. 17 before returning to Box 1506.

Figure 16:
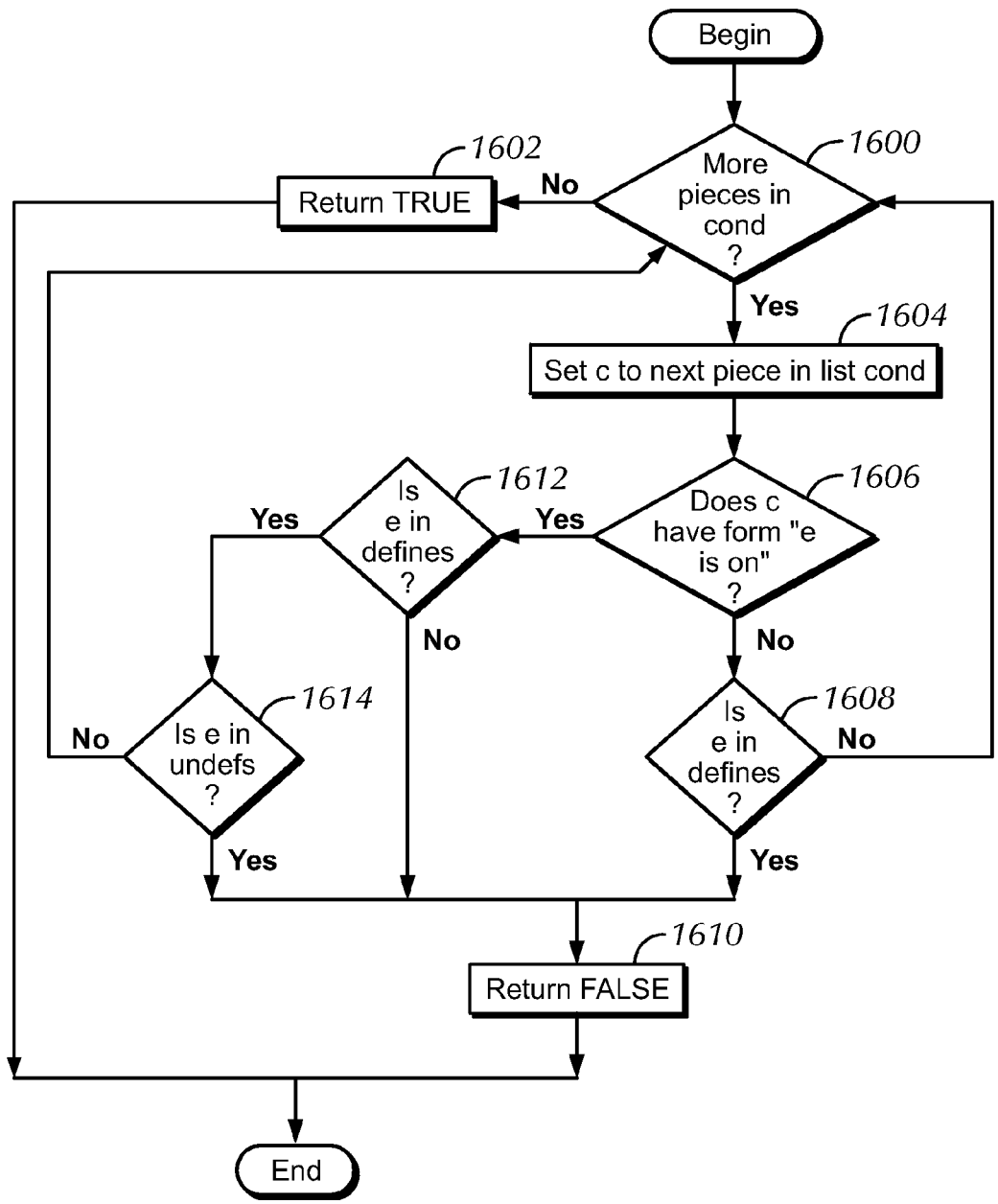
FIG. 16 illustrates the method of Box 1422 of FIG. 14 and Box 1510 of FIG. 15.

FIG. 16 illustrates the method of Box 1422 of FIG. 14 and Box 1510 of FIG. 15. Entering this method, cond contains a list of conditional pieces, each of which is of the form "e is on" or "e is off" for some edit e. The method starts in Box 1600 asking if list cond has any unprocessed conditional pieces in it. If it does not, we return TRUE in Box 1602 and exit; otherwise, Box 1604 sets c to the next conditional piece in list cond and we proceed to Box 1606, where we query whether c has the form "e is on". If it does, we go to Box 1612; otherwise we go to Box 1608, which asks if e is in list defines. If it is not, we return to Box 1600; otherwise, we go to Box 1610 which returns FALSE and exits.

Continuing from Box 1612, we query whether e is in defines. If it is not, we go to Box 1610; otherwise, control proceeds to Box 1614. Here, we ask if e is in list undefs. If it is not, we return to Box 1600; otherwise we go to Box 1610.

Figure 17:
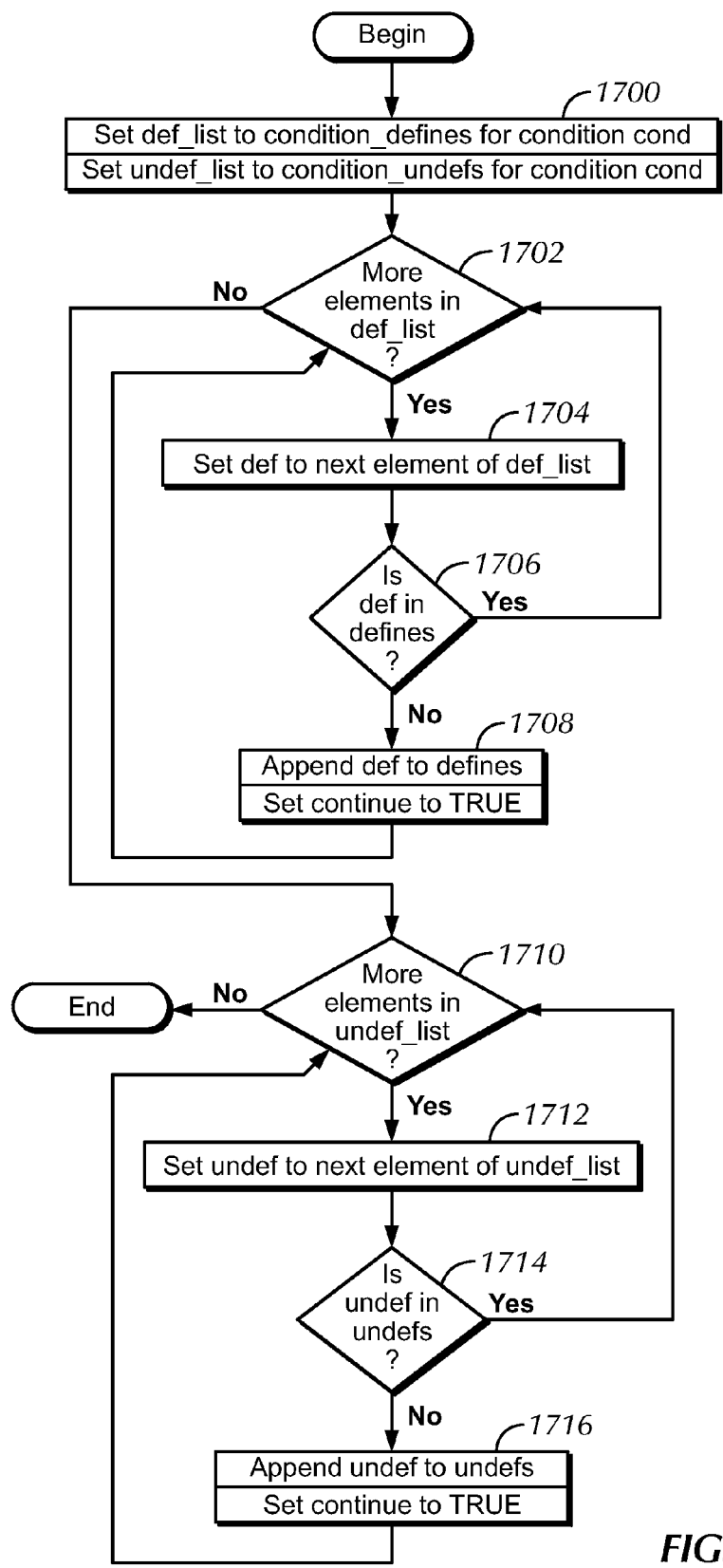
FIG. 17 illustrates the method of Box 1512 of FIG. 15.

FIG. 17 illustrates the method of Box 1512 of FIG. 15. Beginning in Box 1700, we set list def_list to list condition_defines for condition cond and list undef_list to list condition_undefs for condition cond. Next, Box 1702 asks whether there are more unprocessed elements in list def_list. If there are not, we jump to Box 1710; otherwise we go to Box 1704, which sets def to the next unprocessed element of list def_list. We then proceed to Box 1706, in which we query whether def is in list defines. If it is, we return to Box 1702; otherwise we append def to list defines and set continue to TRUE in Box 1708 before returning to Box 1702.

Continuing from Box 1710, we ask if there are more unprocessed elements in list undef_list. If not, we are done; otherwise, we advance to Box 1712, which sets undef to the next unprocessed element in list undef_list and thence to Box 1714. Here, we ask if undef is in list undefs. If it is, we return to Box 1710; otherwise, Box 1716 appends undef to list undefs and sets continue to TRUE before returning to Box 1710.

Figure 18:
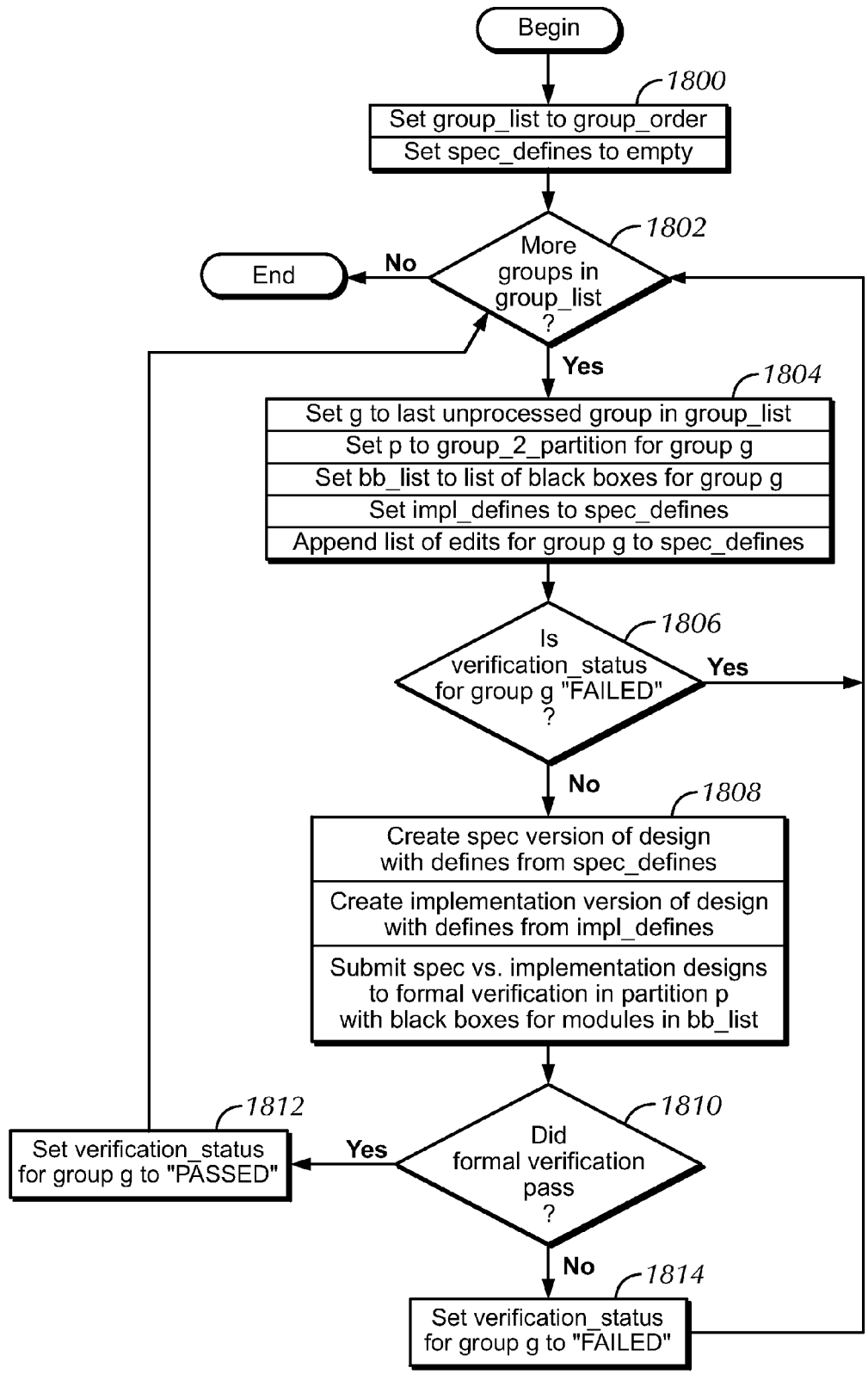
FIG. 18 illustrates the method of Box 214 of FIG. 2.

FIG. 18 illustrates the method of Box 214 of FIG. 2. It starts in Box 1800 which initializes list group_list to list group_order and list spec_defines to empty and proceeds to Box 1802, which asks if there are any unprocessed groups in list group_list. If there are not, we are done; otherwise, we advance to Box 1804. Here, we set g to the last unprocessed group in list group_list, set p to partition group_2_partition for group g (for an embodiment of this invention that supports partitioning the design), set bb_list to the list of black boxes for group g (for an embodiment of this invention that supports black boxes), set impl_defines to spec_defines, and append the list of edits for group g to list spec_defines. Recall that adding defines turns off edits, so we process list group_edit in reverse order. At each step, the specification ("spec") version of the design is the one with additional edits turned off relative to the implementation ("impl") version. The lists spec_defines and impl_defines keep track of the set of defines required to create the specification and implementation designs, respectively. We next go to Box 1806, which queries whether there is already a "FAILED" entry in verification_status for group g due to failure of some earlier check. If there is, we return to Box 1802; otherwise, control advances to Box 1808, in which we create the specification version of the design using the defines from spec_defines, the implementation version of the design using the defines from impl_defines and submit the comparison between the specification and implementation designs to the formal verification engine within partition p and with the modules in list bb_list specified as black boxes. Proceeding to Box 1810, we ask if the formal verification passed. If it did, we advance to Box 1812 to set verification_ status for group g to "PASSED" and return to Box 1802; if it either fails or does not complete due to resource limitations, we go to Box 1814 to set verification_status for group g to "FAILED" before returning to Box 1802.

Figure 19:
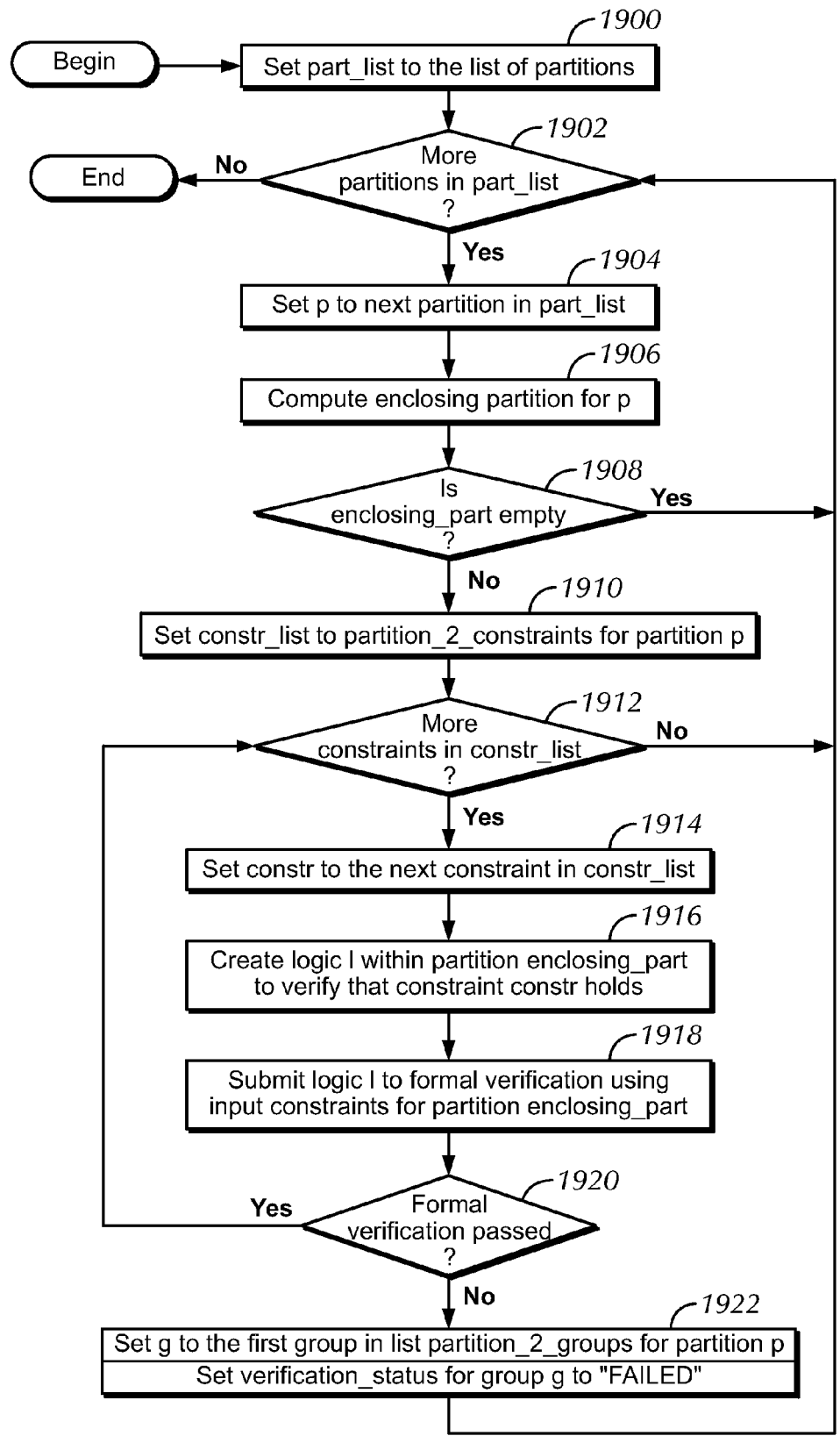
FIG. 19 illustrates the method of Box 216 of FIG. 2.
Figure 20:
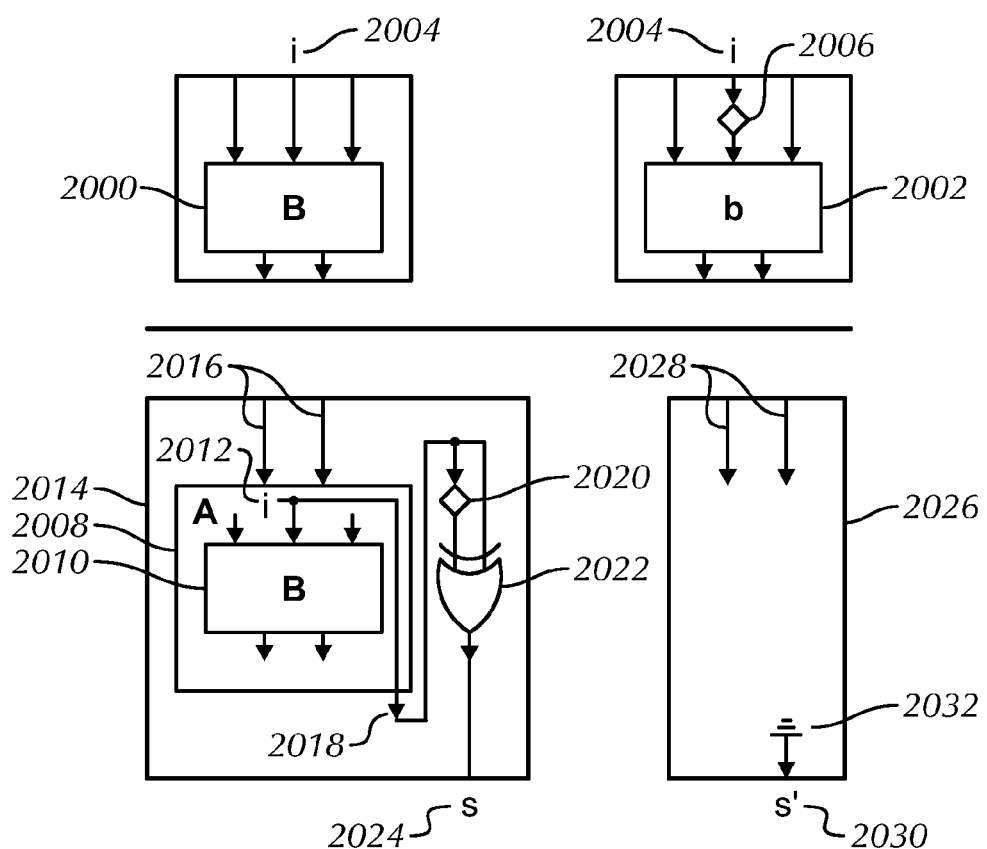
FIG. 20 illustrates an example of logic created in Box 1916 of FIG. 19.

FIG. 19 illustrates the method of Box 216 of FIG. 2. It starts in Box 1900 by setting list part_list to be the list of partitions. Then Box 1902 asks if there are any unprocessed partitions in part_list. If not, we are done; otherwise, we proceed to Box 1904 to set p to the next unprocessed partition in part_list, followed by Box 1906, which computes the enclosing partition enclosing_part for partition p using the method of FIG. 21. Next, we check in Box 1908 whether enclosing_part is empty, indicating that partition p is the top-level hierarchy of the design. If it is empty, we return to Box 1902 to process the next partition; otherwise we progress to Box 1910, which sets list constr_list to list partition_2_constraints for partition p, which was set in Box 204 of FIG. 2. Then we go to Box 1912 to see if there are more unprocessed constraints in list constr_list. If there are not, control returns to Box 1902 to process the next partition; otherwise, we continue to Box 1914. Here, we set constr to the next unprocessed constraint in list constr_list and proceed to Box 1916, which creates logic l within partition enclosing_part to verify that constraint constr holds within partition enclosing_part. An example of such logic is illustrated in FIG. 20. We then submit logic l to formal verification along with the input constraints for partition enclosing_part in Box 1918. Next, Box 1920 checks whether the formal verification passed. If it did, we return to Box 1912 to check the next constraint; otherwise we go to Box 1922, which sets g to the first group in list partition_2_groups for partition p and, assuming g exists, sets verification_status for group g to "FAILED" to flag the fact that a constraint that was relevant to at least one group of edits failed. (If there is no such group g then there were no groups of edits that actually depended upon constraint constr). Finally, control returns to Box 1902 to check the next partition.

FIG. 20 illustrates an example of logic created in Box 1916 of FIG. 19. Assume that a reference block B 2000 is verified as a partition against design block b 2002. Assume that when the outputs of this design block were verified, that input i 2004 was constrained by some input constraint 2006. To verify this constraint, we need to use the enclosing partition A 2008 in the reference design, having reference block B 2010, which is identical to the original reference block B 2000. In this configuration, the signal i 2012 that is an input to B 2010 is generated within partition A 2008. A new reference design 2014 is created with inputs 2016 that feed directly to the inputs of enclosing partition A 2008. The new reference design 2014 also exports signal i 2018 from partition A 2008. This exported signal is then input into the same input constraint logic 2020 that had previously been used 2006 in verifying design block b 2002. The result of the input constraint 2020 is then compared with the exported signal 2018 using XOR logic 2022 to produce output signal s 2024. We also create a new implementation design 2026 with inputs 2028 matching those of enclosing partition A 2008, but which are unused internally. The new implementation design 2026 also has an output s' 2030 that produces a constant logic 0 by being tied to ground 2032. Formal verification will then compare reference output s 2024 with implementation design output s' 2030, which outputs will only be equivalent if there is no way that the output of the input constraint 2020 can differ from signal i 2012.

FIG. 21 illustrates the method of Box 1906 of FIG. 19. Beginning in Box 2100, it sets list p_list to the list of partitions computed in Box 202 of FIG. 2 and sets enclosing_part to empty. Next, Box 2102 asks whether there are unprocessed partitions to consider in list p_list. If there are not, we are done; otherwise, we go to Box 2104 to set p2 to the next unprocessed partition in list p_list and advance to Box 2106 to determine if p2 is equal to p. If it is, it cannot be its own enclosing partition, so we return to Box 2102 to process the next partition; otherwise, we go to Box 2108 to set check_ancestor to p2 and check_child to p. Next, Box 2110 asks whether p2 is an ancestor of p using the method of FIG. 10. If it is not, it cannot be the enclosing partition for p, so we go back to Box 2102; otherwise we execute Box 2112, which checks whether enclosing_part is empty. If it is, p2 is a candidate for the enclosing partition of p, so we go to Box 2114 to set enclosing_part to p2 and return to Box 2102 to check for any partitions that fall between p2 and p; otherwise, both p2 and enclosing_part are ancestors of p, so we advance to Box 2116, which sets check_ancestor to enclosing_part and check_child to p2. Then we go to Box 2118 to see if enclosing_part is an ancestor of p2 using the method of FIG. 10. If it is not, we return to Box 2102; otherwise p2 is our new best candidate for the enclosing partition, so we go to Box 2114 to set enclosing_part to p2 before returning to Box 2102.

To summarize, this invention is a method for accomplishing sequential logical equivalence verification using a hierarchical piecewise approach to avoid problems that are computationally intractable for sequential logical equivalence verification tools. This accomplishment is only possible by severely limiting the number of changes presented to sequential logical equivalence verification tools at any one time; however, doing so in a manual fashion is very error-prone. This invention teaches how to automate limiting the number of changes so as to ensure that the composition of the individual proofs of equivalence constitutes a proof of the global equivalence of two designs. This method starts by providing a reference semiconductor design, a second semiconductor design with logic edits relative to the reference semiconductor design and submitting to formal verification to check the reference design against the second semiconductor design with all edits disabled (Box 200). It then partitions the semiconductor design into a set of partitions (Box 202) and associates with each partition a set of input constraints (Box 204). The edits are further gathered into groups to limit the number of edits submitted to formal verification (Box 206) and these groups are ordered (Box 208). The invention also discovers a set of dependencies of the logic edits (Box 210) and checks that the ordering of groups obeys the dependencies (Box 212). Each group of edits is further submitted to formal verification (Box 214) and any input constraints assumed for any partitions are verified in their enclosing partition (Box 216). Finally, the method reports success if formal verification succeeds on each group of logic edits and on each set of input constraints (Box 218).

Other embodiments of the present invention will be apparent to those skilled in the art after considering this disclosure or practicing the disclosed invention. The specification and examples above are exemplary only, with the true scope of the present invention being determined by the following claims.

We claim the following invention:

1. A method for performing sequential logical formal verification of integrated circuit IC designs using a piecewise hierarchical approach, the method comprising:
   providing a reference IC design;
   providing a modified IC design that includes logic edits relative to said reference IC design;
   a computer performing sequential logical formal verification of logic between said reference IC design and said modified IC design with all of said logic edits disabled;

creating groups of logic edits from said logic edits in said modified IC design;
discovering dependencies between said logic edits in said modified IC design;
ordering said groups of logic edits based upon said dependencies;
checking that said ordering of said groups of logic edits obeys said dependencies between said one or more logic edits in said modified IC design;
the computer performing sequential logical formal verification of logic independently on each of said groups of logic edits in accordance with said ordering; and
tracking a validation status of said sequential logical formal verification of said logic edits.

2. The method as recited in claim 1, further comprising:
providing for each said group of said logic edits a list of modules within said modified IC design to be considered as black boxes;
verifying that each of said list of modules to be considered as black boxes is not required for any logic edit in said group of said logic edits; and
restricting said performing sequential logical formal verification of logic of said group of said logic edits to the portion of said modified IC design exclusive of said list of modules to be considered as black boxes.

3. The method as recited in claim 1, further comprising:
partitioning said modified IC design into a plurality of partitions, each said partition further comprising one or more layers of hierarchy of said modified IC design;
associating with each of said logic edits in said modified IC design an appropriate partition within said plurality of partitions;
associating with each of said group of logic edits a minimal partition that includes said appropriate partition associated with each logic edit in said group of logic edits; and
restricting said performing sequential logical formal verification of logic of said group of said logic edits to said minimal partition.

4. The method as recited in claim 3, further comprising:
providing a set of input constraints for an individual partition in said plurality of partitions of said modified IC design;
identifying for said individual partition an enclosing partition that contains logic surrounding said individual partition; and
performing sequential logical formal verification of logic for said individual partition to verify that said set of input constraints is obeyed in said enclosing partition.

5. A non-transitory computer readable storage device including program instructions, which when executed by a computing device, perform a method for sequential logical formal verification between a reference integrated circuit (IC) design and a modified IC design that includes logic edits relative to the reference IC design using a piecewise hierarchical approach, the method comprising:
performing sequential logical formal verification of logic between said reference IC design and said modified IC design with all of said logic edits disabled;
creating groups of logic edits from said logic edits in said modified IC design;
discovering dependencies between said logic edits in said modified IC design;
ordering said groups of logic edits based upon said dependencies;
checking that said ordering of said groups of logic edits obeys said dependencies between said one or more logic edits in said modified IC design;
performing sequential logical formal verification of logic independently on each of said groups of logic edits in accordance with said ordering; and
tracking a validation status of said sequential logical formal verification of said logic edits.

6. The computer readable storage device as recited in claim 5, further comprising:
providing for each said group of said logic edits a list of modules within said modified IC design to be considered as black boxes;
verifying that each of said list of modules to be considered as black boxes is not required for any logic edit in said group of said logic edits; and
restricting said performing sequential logical formal verification of logic of said group of said logic edits to the portion of said-modified IC design exclusive of said list of modules to be considered as black boxes.

7. The computer readable storage device as recited in claim 5, further comprising:
partitioning said modified IC design into a plurality of partitions, each said partition further comprising one or more layers of hierarchy of said modified IC design;
associating with each of said logic edits in said modified IC design an appropriate partition within said plurality of partitions;
associating with each of said group of logic edits a minimal partition that includes said appropriate partition associated with each logic edit in said group of logic edits; and
restricting said performing sequential logical formal verification of logic of said group of said logic edits to said minimal partition.

8. The computer readable storage device as recited in claim 7, further comprising:
providing a set of input constraints for an individual partition in said plurality of partitions of said modified IC design;
identifying for said individual partition an enclosing partition that contains logic surrounding said individual partition; and
performing sequential logical formal verification of logic for said individual partition to verify that said set of input constraints is obeyed in said enclosing partition.

9. A method for performing a piecewise hierarchical sequential logical formal verification of integrated circuit (IC) designs, the method comprising:
providing a reference IC design;
a computer creating a modified IC design including logic edits relative to said reference IC design;
the computer performing sequential logical formal verification of logic between said reference IC design and said modified IC design with all of said logic edits disabled;
creating groups of logic edits from said logic edits in said modified IC design;
creating a verification ordering of said groups of logic edits in said modified IC design based upon dependencies between said groups of logic edits;
the computer creating instances of said modified IC design, wherein each instance includes one or more enabled groups of logic edits;
the computer performing according to said verification ordering, sequential logical formal verification of logic between successive instances of said modified IC; and
tracking a validation status of each of said logic edits.

10. The method as recited in claim 9, further comprising:
providing for each said group of said logic edits a list of modules within said modified IC design to be considered as black boxes;

verifying that each of said list of modules to be considered as black boxes is not required for any logic edit in a given group of said logic edits; and restricting said performing sequential logical formal verification of logic of said groups of said logic edits to the portion of said modified IC design exclusive of said list of modules to be considered as black boxes.

11. The method as recited in claim 9, further comprising:

partitioning said modified IC design into a plurality of partitions, each said partition further comprising one or more layers of hierarchy of said modified IC design;

associating with each of said logic edits in said modified IC design an appropriate partition within said plurality of partitions;

associating with each of said group of logic edits a minimal partition that includes said appropriate partition associated with each logic edit in said group of logic edits; and restricting said performing sequential logical formal verification of logic of said group of said logic edits to said minimal partition.

12. The method as recited in claim 11, further comprising:

providing a set of input constraints for an individual partition in said plurality of partitions of said modified IC design;

identifying for said individual partition an enclosing partition that contains logic surrounding said individual partition; and performing sequential logical formal verification of logic for said individual partition to verify that said set of input constraints is obeyed in said enclosing partition.

13. The method as recited in claim 9, further comprising determining said dependencies between said groups of logic edits, wherein said determining includes searching within each of said groups of logic edits for logic edits in one group that affect a logic edit in another group.

14. The method as recited in claim 9, wherein said creating a verification ordering of said groups of logic edits includes ensuring that a logic edit in a given group that is dependent on a logic edit in another group is verified after the logic edit in the another group is verified.

15. A non-transitory computer readable storage device including program instuctions executable by a computing device to perform a method for sequential logical formal verification between a reference integrated circuit (IC) design and a modified IC design that includes one or more logic edits relative to the reference IC design using a piecewise hierarchical approach, the method comprising:

providing a reference IC design;

creating a modified IC design including logic edits relative to said reference IC design;

performing sequential logical formal verification of logic between said reference IC design and said modified IC design with all of said logic edits disabled;

creating groups of logic edits from said logic edits in said modified IC design;

creating a verification ordering of said groups of logic edits in said modified IC design based upon dependencies between said groups of logic edits;

creating instances of said modified IC design, wherein each instance includes one or more enabled groups of logic edits;

performing according to said verification ordering, sequential logical formal verification of logic between successive instances of said modified IC; and tracking a validation status of each of said logic edits.

16. The computer readable storage device as recited in claim 15, further comprising determining said dependencies between said groups of logic edits, wherein said determining includes searching within each of said groups of logic edits for logic edits in one group that affect a logic edit in another group.

17. The computer readable storage device as recited in claim 15, wherein said creating a verification ordering of said groups of logic edits includes ensuring that a logic edit in a given group that is dependent on a logic edit in another group is verified after the logic edit in the another group is verified.

18. The computer readable storage device as recited in claim 15, further comprising:

providing for each said group of said logic edits a list of modules within said modified IC design to be considered as black boxes;

verifying that each of said list of modules to be considered as black boxes is not required for any logic edit in a given group of said logic edits; and restricting said performing sequential logical formal verification of logic of said groups of said logic edits to the portion of said modified IC design exclusive of said list of modules to be considered as black boxes.

19. The computer readable storage device as recited in claim 15, further comprising:

partitioning said modified IC design into a plurality of partitions, each said partition further comprising one or more layers of hierarchy of said modified IC design;

associating with each of said logic edits in said modified IC design an appropriate partition within said plurality of partitions;

associating with each of said group of logic edits a minimal partition that includes said appropriate partition associated with each logic edit in said group of logic edits; and restricting said performing sequential logical formal verification of logic of said group of said logic edits to said minimal partition.

20. The computer readable storage device as recited in claim 19, further comprising:

providing a set of input constraints for an individual partition in said plurality of partitions of said modified IC design;

identifying for said individual partition an enclosing partition that contains logic surrounding said individual partition; and performing sequential logical formal verification of logic for said individual partition to verify that said set of input constraints is obeyed in said enclosing partition.

\* \* \* \* \*